(12) United States Patent
Gooneratne et al.

(10) Patent No.: US 11,428,075 B2
(45) Date of Patent: Aug. 30, 2022

(54) SYSTEM AND METHOD OF DISTRIBUTED SENSING IN DOWNHOLE DRILLING ENVIRONMENTS

(71) Applicants: SAUDI ARABIAN OIL COMPANY, Dhahran (SA); Macquarie University, North Ryde (AU)

(72) Inventors: Chinthaka Pasan Gooneratne, Dhahran (SA); Subhas Mukhopadhyay, Beecroft (AU); Bodong Li, Dhahran (SA); Guodong Zhan, Dhahran (SA); Arturo Magana-Mora, Dhahran (SA); Timothy Eric Moellendick, Dhahran (SA)

(73) Assignees: SAUDI ARABIAN OIL COMPANY, Dhahran (SA); Macquarie University, Sydney (AU)

( * ) Notice: Subject to any disclaimer, the term of this patent is extended or adjusted under 35 U.S.C. 154(b) by 15 days.

(21) Appl. No.: 16/944,796

(22) Filed: Jul. 31, 2020

(65) Prior Publication Data
US 2022/0034198 A1 Feb. 3, 2022

(51) Int. Cl.
*E21B 41/00* (2006.01)
*E21B 47/26* (2012.01)
(Continued)

(52) U.S. Cl.
CPC .......... *E21B 41/0085* (2013.01); *E21B 47/00* (2013.01); *E21B 47/12* (2013.01);
(Continued)

(58) Field of Classification Search
CPC ...... E21B 41/0085; E21B 47/00; E21B 47/12; E21B 47/26; G01V 11/002; H01M 10/46; H02N 1/04; H02N 2/18
See application file for complete search history.

(56) References Cited

U.S. PATENT DOCUMENTS 3,578,081 A * 5/1971 Bodine ................... E21B 28/00
166/249
6,830,379 B2 12/2004 Morita et al.
(Continued)

FOREIGN PATENT DOCUMENTS

CN 106130401 B 11/2017
CN 109267999 A 1/2019
(Continued)

OTHER PUBLICATIONS

International Search Report and Written Opinion of the International Searching Authority issued in corresponding International Application No. PCT/US2020/051518, dated Apr. 19, 2021 (13 pages).
(Continued)

*Primary Examiner* — Brad Harcourt
(74) *Attorney, Agent, or Firm* — Osha Bergman Watanabe & Burton LLP

(57) ABSTRACT

A system includes sensing modules positioned along a length of a drill string. Each sensing module includes a structure arrangement composed of an outer structure body having a cavity and an inner structure body rotatably supported within the cavity. The structure arrangement is coupled to the drill string such that rotation of the drill string produces a relative rotation between the structure bodies. Ball elements are disposed in a gap between the structure bodies and move along a predetermined path defined in the gap in response to relative rotation between the structure bodies. Movable elements are positioned to physically interact with the ball elements as the ball elements move along the predetermined path. Energy harvesters in the sensor modules generate electrical energy from the mechanical energy produced by physical interaction between the ball elements and movable elements. The sensing modules (Continued)

include sensors to measure parameters in the drill string environment.

15 Claims, 25 Drawing Sheets

(51) Int. Cl.
  *E21B 47/00* (2012.01)
  *E21B 47/12* (2012.01)
  *G01V 11/00* (2006.01)
  *H01M 10/46* (2006.01)
  *H02N 1/04* (2006.01)
  *H02N 2/18* (2006.01)

(52) U.S. Cl.
  CPC ............ *E21B 47/26* (2020.05); *G01V 11/002* (2013.01); *H01M 10/46* (2013.01); *H02N 1/04* (2013.01); *H02N 2/18* (2013.01)

(56) References Cited

U.S. PATENT DOCUMENTS

| | | |
|---|---|---|
| 8,284,075 B2 | 10/2012 | Fincher et al. |
| 8,890,341 B2 | 11/2014 | Ocalan et al. |
| 10,066,474 B2 | 9/2018 | Rodney et al. |
| 10,431,998 B2 | 10/2019 | Olah |
| 2002/0148648 A1 | 10/2002 | Schultz et al. |
| 2005/0024231 A1 | 2/2005 | Fincher et al. |
| 2005/0051323 A1 | 3/2005 | Fripp et al. |
| 2006/0016606 A1 | 1/2006 | Tubel et al. |
| 2006/0086498 A1 | 4/2006 | Wetzel et al. |
| 2008/0247273 A1 | 10/2008 | Chemali et al. |
| 2010/0133006 A1 | 6/2010 | Shakra et al. |
| 2010/0219646 A1 | 9/2010 | Hay |
| 2011/0210645 A1 | 9/2011 | Mason |
| 2012/0228882 A1* | 9/2012 | Dirksen .............. E21B 41/0085 290/1 R |
| 2013/0026766 A1 | 1/2013 | Ocalan et al. |
| 2013/0118733 A1* | 5/2013 | Kumar ................ E21B 41/0085 166/254.2 |
| 2013/0307278 A1* | 11/2013 | Coonrod ............... E21B 17/028 290/1 R |
| 2013/0328442 A1* | 12/2013 | Hay ..................... H01L 41/125 310/300 |
| 2014/0069720 A1 | 3/2014 | Gray |
| 2015/0096744 A1 | 4/2015 | Signorelli et al. |
| 2015/0176344 A1 | 6/2015 | McLoughlin et al. |
| 2015/0240632 A1 | 8/2015 | Heinonen et al. |
| 2016/0090821 A1 | 3/2016 | Kim |
| 2016/0164437 A1 | 6/2016 | Kim et al. |
| 2016/0258254 A1 | 9/2016 | Guo et al. |
| 2017/0067333 A1 | 3/2017 | Peters et al. |
| 2018/0066513 A1 | 3/2018 | Sugiura et al. |
| 2018/0094685 A1 | 4/2018 | Marya et al. |
| 2018/0262127 A1 | 9/2018 | Gooneratne et al. |
| 2018/0347319 A1 | 12/2018 | Feluch et al. |
| 2019/0112919 A1 | 4/2019 | Song et al. |
| 2019/0284907 A1 | 9/2019 | Loh et al. |
| 2019/0361139 A1 | 11/2019 | Palmer et al. |

FOREIGN PATENT DOCUMENTS

| | | |
|---|---|---|
| CN | 110474559 A | 11/2019 |
| CN | 110518826 A | 11/2019 |
| EP | 1250512 A1 | 10/2002 |
| JP | 2004212347 A | 7/2004 |
| NL | 7907085 A | 3/1981 |
| SU | 1434088 A1 | 10/1988 |
| WO | 2009030925 A2 | 3/2009 |
| WO | 2010008382 A1 | 1/2010 |
| WO | 2017160305 A1 | 9/2017 |
| WO | 2018169906 A1 | 9/2018 |
| WO | 2019169510 A1 | 9/2019 |

OTHER PUBLICATIONS

International Search Report and Written Opinion of the International Searching Authority issued in corresponding International Application No. PCT/US2020/051526, dated Apr. 22, 2021 (15 pages).
International Search Report and Written Opinion of the International Searching Authority issued in corresponding International Application No. PCT/US2020/051531, dated Apr. 20, 2021 (17 pages).
Arms, S.W. et al., "Power Management for Energy Harvesting Wireless Sensors", SPIE Int'l Symposium on Smart Structures & Materials, Society of Photo-Optical Instrumentation Engineers, Mar. 2005 (9 pages).
Mallineni, Sai Sunil Kumar et al., "A Wireless Triboelectric Nanogenerator", 1702736, Communication: Triboelectric Nanogenerators, Advanced Energy Materials, Wiley-VCH Verlag GmbH & Co. KGaA, 2017 (7 pages).
Babayo, Aliyu Aliyu et al., "A Review on energy management schemes in energy harvesting wireless sensor networks", Renewable and Sustainable Energy Reviews, ScienceDirect, Elsevier Ltd., vol. 76, Mar. 2017, pp. 1176-1184 (9 pages).
Beeby, S P et al., "Energy harvesting vibration sources for microsystems applications", Review Article, Measurement Science and Technology, Institute of Physics Publishing, vol. 17, Oct. 2006, pp. R175-R195 (21 pages).
Briscoe, Joe and Steve Dunn, "Piezoelectric nanogenerators—a review of nanostructured piezoelectric energy harvesters", Nano Energy, ScienceDirect, Elsevier Ltd., vol. 14, Jan. 2015, pp. 15-29 (15 pages).
Lethien, Christophe et al., "Challenges and prospects of 3D micro-supercapacitors for powering the internet of things", Energy & Environmental Science, Royal Society of Chemistry, Oct. 2018 (20 pages).
Cheng, Gang et al., "Managing and maximizing the output power of a triboelectric nanogenerator by controlled tip-electrode air-discharging and application for UV sensing", Nano Energy, ScienceDirect, Elsevier Ltd., vol. 44, Dec. 2017, pp. 208-216 (9 pages).
Cook-Chennault, K A et al., "Topical Review: Powering MEMS portable devices—a review of non-regenerative and regenerative power supply systems with special emphasis on piezoelectric energy harvesting systems", Smart Materials and Structures, IOP Publishing, vol. 17, No. 043001, Jun. 2008 (33 pages).
Dong, Lin et al., "Vibration-Energy-Harvesting System: Transduction Mechanisms, Frequency Tuning Techniques, and Biomechanical Applications", Review: Energy Harvesting, Advanced Materials Technologies, Wiley-VCH Verlag GmbH & Co. KGaA, Aug. 2019 (28 pages).
Elvin, N et al., "A self-powered damage detection sensor", S07401, J. Strain Analysis, IMechE, vol. 38, No. 2, 2003, pp. 115-124 (10 pages).
Wang, Xianfu et al., "Flexible Energy-Storage Devices: Design Consideration and Recent Progress", Material Views, Advanced Materials, Wiley-VCH Verlag GmbH & Co. KGaA, vol. 26, 2014, pp. 4763-4782 (20 pages).
Guan, Mingjie and Wei-Hsin Liao, "Design and analysis of a piezoelectric energy harvester for rotational motion system", Envery Conversion and Management, ScienceDirect, Elsevier Ltd., vol. 111, Jan. 2016, pp. 239-244 (6 pages).
Han, Mengdi et al., "Magnetic-assisted triboelectric nanogenerators as self-powered visualized omnidirectional tilt sensing system", Scientific Reports, vol. 4, No. 4811, Apr. 2014 (7 pages).
Hester, Josiah and Jacob Sorber, "Flicker: Rapid Prototyping for the Batteryless Internet-of-Things", SenSys '17, Association for Computing Machinery, Nov. 2017 (13 pages).
Huang, Jun et al., "Wireless Power Transfer and Energy Harvesting: Current Status and Future Prospects", IEEE Wireless Communications, Aug. 2019, pp. 163-169 (7 pages).
Jeerapan, Itthipon and Sujittra Poorahong, "Review—Flexible and Stretchable Electrochemical Sensing Systems: Materials, Energy

(56) References Cited

OTHER PUBLICATIONS

Sources, and Integrations", Journal of the Electromechanical Society, The Electromechanical Society, IOP Publishing, vol. 167, No. 037573, Mar. 2020 (19 pages).
Jia, Rui et al., "Flexible on-chip micro-supercapacitors: Efficient power units for wearable electronics", Energy Storage Materials, ScienceDirect, Elsevier B.V., vol. 27, Jan. 2020, pp. 169-186 (18 pages).
Kang, Min-Gyu et al., "Review: Recent Progress on PZT Based Piezoelectric Energy Harvesting Technologies", Actuators, MDPI, vol. 5, No. 5, Feb. 2016 (17 pages).
Kyeremateng, Nana Amponash et al., "Microsupercapacitors as miniturized energy-storage components for on-chip electronics", Nature Nanotechnology, Macmillan Publishers Limited, vol. 12, Nov. 2016, pp. 7-15 (9 pages).
Chen, Zheng et al., "Combustion and emissions characteristics of high n-butanol/diesel ratio blend in a heavy-duty diesel engine and EGR impact", Energy Conversion and Management, ScienceDirect, Elsevier Ltd., vol. 78, Dec. 2013, pp. 787-795 (9 pages).
Lee, Jae Won et al., "Robust nanogenerators based on graft copolymers via control of dielectrics for remarkable output power enhancement", Applied Sciences and Engineering, Science Advances, American Association for the Advancement of Science, vol. 3, May 2017 (10 pages).
LaCost, Eddie, "Battery-Less NFC/RFID Temperature Sensing Patch", Application Report, SLOA212A, Texas Instruments Incorporated, Dec. 2014; Revised Feb. 2016 (12 pages).
"TI Designs: Multi-Standard CC2650 SensorTag Design Guide", TIDU862, Texas Instruments Incorporated, Mar. 2015 (40 pages).
"ADXL362 Data Shee", Analog Devices: Micropower, 3-Axis, ±2 g|±4 g|±8 g Digital Output MEMS Accelerometer, Analog Devices, Inc., Aug. 2012 (43 pages).
Frantzke, Andre, "A Low-Power Battery-Less Wireless Temperature and Humidity Sensor for the TI PALFI Device", Application Report: SWRA395, Texas Instruments Incorporated, Nov. 2011 (21 pages).
"DRV5032 Ultra-Low-Power Digital-Switch Hall Effect Sensor", SLVSDC7E, Texas Instruments Incorporated, Apr. 2017, Revised Jan. 2020 (40 pages).
"MEMS digital output motion sensor: ultra-low-power-high-performance 3-axis 'nano' accelerometer", LIS3DH, Datasheet—production data, DocID17530, Rev. 2, ST: life.augmented, Dec. 2016 (54 pages).
Liu, Qi et al., "Wireless Single-Electrode Self-Powered Piezoelectric Sensor for Monitoring", ACS Applied Materials & Interfaces, American Chemical Society, vol. 12, Jan. 2020, pp. 8288-8295 (8 pages).
Najafi, K. et al., "Microsystems for Energy Harvesting", W1D.001, Transducers '11, IEEE, Jun. 2011, pp. 1845-1850 (6 pages).
Yang, Peihua and Wenjie Mai, "Flexible solid-state electrochemical supercapacitors", Nano Energy, ScienceDirect, Elsevier Ltd., vol. 8, Jun. 2014, pp. 274-290 (17 pages).
Khan, Asif Abdullah et al., "A self-powered multi-broadcasting wireless sensing system realized with an all-in-one triboelectric nanogenerator", Nano Energy, ScienceDirect, Elsevier Ltd., vol. 62, Jun. 2019, pp. 691-699 (9 pages).
Nechibvute, Action et al., "Review Article: Piezoelectric Energy Harvesting Devices: An Alternative Energy Source for Wireless Sensors", Article ID 853481, Smart Materials Research, Hindawi Publishing Corporation, 2012 (13 pages).
Park, Kwi-Il et al., "Highly-Efficient, Flexible Piezoelectric PZT Thin Film Nanogenerator on Plastic Substrates", Advanced Materials, Materials Views, Wiley-VCH Verlang GmbH & Co. KGaA, vol. 26, 2014, pp. 2514-2520 (7 pages).
Patil, Swati and Dong-Weon Lee, "Topical Review: Status review on the MEMS-based flexible supercapacitors", Journal of Micromechanics and Microengineering, IOP Publishing, vol. 29, No. 093001, Jun. 2019 (21 pages).
Selvan, Krishna Veni et al., "Micro-scale energy harvesting devices: Review of methodological performances in the last decade", Renewable and Sustainable Energy Reviews, ScienceDirect, Elsevier Ltd., vol. 54, Nov. 2015, pp. 1035-1047 (13 pages).
Shaikh, Faisal Karim and Sherali Zeadally, "Energy harvesting in wireless sensor networks: A comprehensive review", Renewable and Sustainable Energy Reviews, ScienceDirect, Elsevier Ltd., vol. 55, Dec. 2015, pp. 1041-1054 (14 pages).
Shenck, Nathan S. and Joseph A. Paradiso, "Energy Scavenging with Shoe-Mounted Piezoelectronics", IEEE Micro, IEEE, May-Jun. 2001, pp. 30-42 (13 pages).
Siddique, Abu Raihan Mohammad et al., "A comprehensive review on vibration based micro power generators using electromagnetic and piezoelectric transducer mechanisms", Energy Conversion and Management, ScienceDirect, Elsevier Ltd., vol. 106, Oct. 2015, pp. 728-747 (20 pages).
Li, Bodong et al., "Implementation of a Drilling Microchip for Downhole Data Aquisition", SPE-186330-MS, Society of Petroleum Engineers, Oct. 2017 (9 pages).
Tang, Wei et al., "A power-transformed-and-managed triboelectric nanogenerator and its applications in a self-powered wireless sensing node", Nanotechnology, IOP Publishing, vol. 25, No. 225402, May 2014 (7 pages).
Dekkers, Gert et al., "The Sins Database for Detection of Daily Activities in a Home Environment Using an Acoustic Sensor Network", Detection and Classification of Acoustic Scenes and Events, Nov. 2017 (5 pages).
Toprak, Alperen and Onur Tigli, "Piezoelectric energy harvesting: State-of-the-art and challenges", Applied Physics Reviews, AIP Publishing LLC, vol. 1, No. 031104, Sep. 2014 (14 pages).
Dubal, Deepak P. et al., "Towards flexible solid-state supercapacitors for smart and wearable electronics", Chemical Society Reviews, Royal Society of Chemistry, vol. 47, Feb. 2018, pp. 2065-2129 (65 pages).
Schaijk, R. van et al., "A MEMS vibration energy harvester for automotive applications", Smart Sensors, Actuators, and MEMS VI, Eds. Ulrich Schmid et al., SPIE, vol. 8763, No. 876305-1, 2013 (10 pages).
Vasandani, Paresh et al., "Using a synchronous switch to enhance output performance of triboelectric nanogeneratores", Nano Energy, ScienceDirect, Elsevier Ltd., vol. 43, Nov. 2017, pp. 210-218 (9 pages).
Peng, Limin et al., "Research Article: Mechanic and Acoustic Properties of the Sound-Absorbing Material Made from Natural Fiber and Polyester", Article ID 274913, Advances in Materials Science and Engineering, Hindawi Publishing Corporation, vol. 2015 (5 pages).
Wang, Zhong Lin et al., "Progress in triboelectric nanogenerators as new energy technology and self-powered sensors", Energy & Environmental Science, RSC Publishing, The Royal Society of Chemistry, Jan. 2014 (41 pages).
Wang, Zhong Lin et al., "Progress in nanogenerators for portable electronics", Materials Today, Elsevier Ltd., vol. 15, No. 12, Dec. 2012, pp. 532-543 (12 pages).
Wang, Sihong et al., "Nanoscale Triboelectric-Effect-Enabled Energy Conversion for Sustainability Powering Portable Electronics", Nano Letters, ACS Publications, American Chemical Society, vol. 12, Nov. 2012, pp. 6339-6346 (8 pages).
Wang, Zhong Lin and Wenzhou Wu, "Nanotechnolgy-Enabled Energy Harvesting for Self-Powered Micro-/Nanosystems", Angewandte Reviews, Angewandte Chemie: International Edition, Wiley-VCH Verlag GmbH & Co. KGaA, vol. 51, 2012, pp. 2-24 (23 pages).
Wei, Chongfeng and Xingjian Jing, "A comprehensive review on vibration energy harvesting: Modelling and realization", Renewable and Sustainable Energy Reviews, ScienceDirect, Elsevier Ltd., vol. 74, Feb. 2017, pp. 1-18 (18 pages).
Xie, Yuedong et al., "A self-powered radio frequency (RF) transmission system based on the combination of triboelectric nanogenerator (TENG) and piezoelectric element for disaster rescue/relief", Nano Energy, Author's Accepted Manuscript, Elsevier Ltd., Oct. 2018 (24 pages).
Yang, Zhengbao et al., "High-Performance Piezoelectric Energy Harvesters and Their Applications", Joule, CellPress, Elsevier Inc., vol. 2, Apr. 2018. pp. 642-697 (56 pages).

(56) References Cited

OTHER PUBLICATIONS

Zhang, Xingtian et al., "A portable high-efficiency electromagnetic energy harvesting system using supercapacitors for renewable energy applications in railroads", Energy Conversion and Management, ScienceDirect, Elsevier Ltd., vol. 118, Apr. 2016, pp. 287-294 (8 pages).

Zhao, Shulin et al., "Advances in Sn-Based Catalysts for Electrochemical CO2 Reduction", Nano-Micro Letters, Shanghai Jiao Tong University Press, Springer, vol. 11, No. 62, Jul. 2019 (19 pages).

Zou, Hong-Xiang et al., "Mechanical modulations for enhancing energy harvesting: Principles, methods and applications", Applied Energy, ScienceDirect, Elsevier Ltd., vol. 255, No. 113871, Sep. 2019 (18 pages).

"Wireless environmental sensor: Wireless environmental sensor system integrated circuits and reference designs", Texas Instruments Incorporated, Access Date: Oct. 27, 2020, URL:<https://www.ti.com/solution/wireless-environmental-sensor> (3 pages).

"MEMS and Sensors", ST Life.Augmented, STMicroelectronics, Access Date: Oct. 27, 2020, URL: https://www.st.com/en/mems-and-sensors.html> (2 pages).

"SQ-MIN-200: Tilt & Vibration Sensor, Ultra Low Power, Omnidirectional", SignalQuest: Precision Microsensors, SignalQuest, LLC, Access Date: Oct. 27, 2020, URL:<https://signalquest.com/product/components/sq-min-200/> (3 pages).

"Solutions for sensor networks for the Internet of Things", IMEC, Access Date: Oct. 27, 2020, URL:<https://www.imec-int.com/en/sensor-networks-for-IoT> (11 pages).

"Ultrasocic Time of Flight Sensing: Introducing the CH201 Long-Range Ultrasonic Time-of-Flight Sensor", TDK Chirp Microsystems, Chirp Microsystems, Inc., Access Date: Oct. 27, 2020, URL:<https://www.chirpmicro.com/> (10 pages).

"URM07-UART Low-Power Consumption Ultrasonic Sensor (20~750cm)", DFROBOT: Drive the Future, DFRobot, Date Accessed: Oct. 27, 2020, URL:<https://www.dfrobot.com/product-1057.html> (4 pages).

"PTC2202UK: Ultra-low-power, 1.8V, 1 deg. C accuracy, digital temperature sensor with I2C bus interface", NXP, NXP Semiconductors, Access Date: Oct. 27, 2020, URL:<https://www.nxp.com/products/sensors/ic-digital-temperature-sensors/ultra-low-power-1-8-v-1-deg-c-accuracy-digital-temperature-sensor-with-ic-bus-interface:PCT2202UK> (2 pages).

"STMicroelectronics Outlines Always-On 6-Axis Ultra-Performance Accelerometer/Gyroscope Combo that Drops the Power/Space Bar", ST Life.Augmented, STMicroelectronics, Sep. 2014, URL:<https://www.st.com/content/st_com/en/about/media-center/press-item.html/p3610d.html> (2 pages).

"Ultra-low Power Management", EnOcean Self-powered IoT, EnOcean GmbH, Access Date: Oct. 27, 2020, URL: <https://www.enocean.com/en/technology/energy-harvesting-wireless/> (2 pages).

"Self-Powered Industrial IoT", Everactive, Access Date: Oct. 27, 2020, URL:<https://everactive.com/#tech-page> (7 pages).

"Ultra-Low Power Management for IoT Devices", Article Library, Digi-Key Electronics, Jan. 2018, URL:<https://www.digikey.com/en/articles/ultra-low-power-management-for-iot-devices> (8 pages).

"Smaller, Smarter, Ultra-Low-Power Sensors Raise Potential for Energy Harvesting in Medical Implants", Article Library, Digi-Key Electronics, Sep. 2013, URL:<https://www.digikey.com/en/articles/smaller-smarter-ultralowpower-sensors-raise-potential-for-energy-harvesting-in-medical-implants> (7 pages).

"No Dilemma: Realtime Data, immediate Alerting and longest Battery Endurance", Technologies: Ultra Low Power Sensors, Pikkerton; Ein Unternehmen der Thelen-Gruppe, Pikkerton GmbH, Access Date: Oct. 27, 2020, URL: <https://www.pikkerton.com/Technologies/UltraLowPowerSensors/UltraLowPowerSensors.htm> (2 pages).

Kanegaonkar, Hari B., "Smart Technology Applications in Offshore Structural Systems: Status and Needs", Proceedings of the Ninth (1999) International Offshore and Polar Engineering Conference, The International Society of Offshore and Polar Engineers, May 1999, pp. 231-236 (6 pages).

Gilbertson, Eric et al., "A Thermally Actuated Gas-Lift Safety Valve", SPE 161930, SPE Production & Operations, Society of Petroleum Engineers, Feb. 2013, pp. 77-84 (8 pages).

Wang, Lei and F G Yuan, "Vibration energy harvesting by magnetostrictive material", Smart Materials and Structures, IOP Publishing, vol. 17, No. 045009, Jun. 2008 (14 pages).

Beidaghi, Majid and Yury Gogotsi, "Capacitive energy storage in micro-scale devices: recent advances in design and fabrication of micro-supercapacitors", Energy & Environmental Science, Royal Society of Chemistry, vol. 7, Jan. 2014, pp. 867-884 (18 pages).

Liu, Wei et al., "Flexible and Stretchable Energy Storage: Recent Advances and Future Perspectives", Materials Views, Advanced Materials, Wiley-VCH Verlag GmbH & Co. KGaA, 2016 (34 pages).

Wang, Peihong et al., "Complementary Electromagnetic-Triboelectric Active Sensor for Detecting Multiple Mechanical Triggering", Advanced Functional Materials, Wiley-Verlag GbmH & Co. KGaA, vol. 28, No. 1705808, 2018 (9 pages).

Wang, Faxing et al., "Latest advances in supercapacitors: from new electrode materials to novel device designs", Chemical Society Reviews, Royal Society of Chemistry, vol. 46, Sep. 2017, pp. 6816-6854 (39 pages).

Zhai, Shengli et al., "1D Supercapacitors for Emerging Electronics: Current Status and Future Directions", Author Manuscript, doi: 10.1002/adma.201902387 (36 pages).

Zhang, Xu et al., "MXene-based materials for electrochemical energy storage", Journal of Energy Chemistry, ScienceDirect, Elsevier B.V., vol. 27, Aug. 2017, pp. 73-85 (13 pages).

Zhang, Panpan et al., "Two-dimensional materials for miniaturized energy storage devices: from individual devices to smart integrated systems", Chemical Society Reviews, Royal Society of Chemistry, vol. 47, Sep. 2018, pp. 7426-7451 (26 pages).

Lin, Zong-Hong et al., "Triboelectric Nanogenerator as an Active UV Photodetector", Material Views, Advanced Functional Materials, Wiley-VCH Verlag GmbH & Co. KGaA, vol. 24, 2014, pp. 2810-2816 (7 pages).

Hu, Youfan and Zhong Lin Wang, "Recent Progress in Piezoelectric Nanogenerators as Sustainable Power Source in Self-powered Systems and Active Sensors", Nano Energy, ScienceDirect, Elsevier Ltd., vol. 14, May 2015 (26 pages).

Wen, Xiaonan et al., "Development and progress in piezoelectronics", Nano Energy, ScienceDirect, Elsevier Ltd., 2015 (20 pages).

Zhang, Xiao-Sheng et al., "High performance triboelectric nanogenerators based on large-scale mass-fabrication technologies", Nano Energy, ScienceDirect, Elsevier Ltd., vol. 11, Nov. 2014, pp. 304-322.

Kim, Dong Hyun et al., "In Vito Self-Powered Wireless Transmission Using Biocompatible Flexible Energy Harvesters", Energy Harvesting, Advanced Functional Materials, Wiley-VCH Verlag GmbH & Co. KGaA, vol. 27, No. 1700341, 2017 (8 pages).

Zhu, Dibin et al., "A credit card sized self powered smart sensor node", Sensors and Actuators A: Physical, ScienceDirect, Elsevier B.V., 2011, doi:10.1016/j.sna.2011.01.015 (9 pages).

Zhu, Guang et al., "Self-Powered, Ultrasensitive, Flexible Tactile Sensors Based on Contact Electrification", Nano Letters, ACS Publications, American Chemical Society, vol. 14, May 2014, pp. 3208-3213 (6 pages).

Chen, Yandong et al., "Energy Harvesting and Wireless Power Transmission by a Hybridized Electromagnetic-triboelectric Nanogenerator", Energy & Environmental Science, 2019, doi:10.1039-C9EE01245A, (8 pages).

Yang, Hongmei et al., "A full-packaged rolling triboelectric-electromagnetic hybrid nanogenerator for energy harvesting and building up self-powered wireless systems", Nano Energy, Nov. 2018, https://doi.org/10.1016/j.nanoen.2018.11.043 (26 pages).

Zhang, Shuo et al., "Strain-controlled power devices as inspired by human reflex", Nature Communications, 2020, https://doi.org/10.1038/s41467-019-14234-7 (9 pages).

Liu, Guanlin et al., "Wireless Electric Energy Transmission through Various Isolated Solid Media Based on Triboelectric Nanogenera-

(56) References Cited

OTHER PUBLICATIONS tor", Triboelectric Nanogenerators, Advanced Energy Materials, Wiley-VCH Verlag GmbH & Co. KGaA, No. 1703086, 2018 (7 pages).
Cao, Shengli et al., "Wireless Power Transmission Enabled by a Triboelectric Nanogenerator via a Magnetic Interaction", Energy Technology, Wiley-VCH Verlag GmbH & Co. KGaA, vol. 7, No. 1900503, 2019 (6 pages).
"STMicroelectronics LIS2D MEMS Digital Output Motion Sensors", ST life.augmented, Sep. 2018, URL: <https://www.mouser.com/new/sensors/motion-position-sensors/stm-lis2dh/n-6g7q6Z28tvc4> (3 pages).
International Search Report and Written Opinion issued in Application No. PCT/US2020/051539, dated Apr. 26, 2021 (15 pages).
Non-Final Office Action issued in corresponding U.S. Appl. No. 16/944,745 dated Oct. 22, 2021 (40 pages).

* cited by examiner

SYSTEM AND METHOD OF DISTRIBUTED SENSING IN DOWNHOLE DRILLING ENVIRONMENTS

FIELD

The disclosure relates generally to methods, apparatus, and systems for monitoring conditions in downhole drilling environments.

BACKGROUND

To produce hydrocarbons from a subsurface reservoir, one or more wellbores that penetrate the subsurface reservoir typically have to be formed. A wellbore is formed by cutting through rock formations in the subsurface using a drill bit at a bottom end of a drill string. Drilling of the wellbore typically involves pumping drilling fluid down the drill string from the surface while rotating the drill string from the surface, where the drilling fluid (or mud) exits the drill bit into the bottom of the wellbore and then flows up an annulus between the drill string and the wellbore to the surface. The hydrocarbon reservoir may be several thousand feet into the subsurface. Since drillers are unable to see the trajectory of the wellbore being drilled and the downhole environment, surveying and logging tools, such as wireline and measurement-while-drilling (MWD)/logging-while-drilling (LWD) tools, play a critical role during the drilling process.

Wireline and MWD/LWD tools acquire data that are representative of the downhole condition of the well. Drillers at the surface can use these data to make effective and timely decisions. In wireline operations, the wireline sensors and instrumentation are powered through a wired power line that extends from a power source at the surface to the depth in the well at which measurements are to be made. However, since the drill string has to be pulled out of the wellbore before running the wireline tool into the wellbore, downhole logging data cannot be obtained while drilling. Unlike wireline tools, MWD/LWD tools are integrated into the drill string and can obtain real-time data while drilling and transmit this data to the surface by mud pulse telemetry or other wellbore telemetry system, such as electromagnetic telemetry system or acoustic telemetry system.

MWD/LWD tools are powered by non-rechargeable, one-time use, disposable lithium thionyl chloride battery packs. If the battery packs are exposed to temperatures in excess of 180° C., the lithium metal in the battery packs will melt, which may cause a violent, accelerated reaction and explosion that is large enough to create a hole through the pressure housing of the tool and damage the tool. Since temperatures downhole can exceed 180° C., the possibility of exploding batteries and tool is real. Batteries are also expensive, discharge over time—a process that is accelerated by high temperatures—require maintenance or replacement, and have the added cost of safe disposal due to the chemicals they contain.

Power consuming parts of MWD/LWD tools, such as data acquisition and transmission of this data to the surface, may be powered by turbines that harness the kinetic energy of a fluid to generate electricity. The power generated by the turbines is proportional to the flow rate of the drilling fluid. Thus, any event that reduces the speed of flow in the drill string, such as heavy drilling fluids pumped down the drill string or lost circulation material in the drill string, reduces the power generated by the turbines. Events such as lost circulation material in the drill string may even block the flow pathway through the turbines, leading to zero power generation.

SUMMARY

A system includes a drill string having at least one drill pipe and a drill bit. The system includes a plurality of sensing modules positioned along a length of the drill string. Each of the sensing modules includes a structure arrangement including an outer structure body having a cavity and an inner structure body rotatably supported within the cavity. The structure arrangement is coupled to the drill string such that rotation of the drill string produces a relative rotation between the outer structure body and the inner structure body. Each of the sensing modules includes a plurality of ball elements disposed in a gap between the outer structure body and the inner structure body of the sensing module. The plurality of ball elements are movable along a predetermined path defined in the gap in response to the relative rotation between the inner structure body and the outer structure body. Each sensing module includes a plurality of movable elements positioned to physically interact with the plurality of ball elements as the plurality of ball elements move along the predetermined path. Each sensing module includes a plurality of energy harvesters positioned to generate electrical energy from mechanical energy produced by the physical interaction between the ball elements and the movable elements. Each sensing module includes at least one sensor to measure one or more parameters in an environment of the drill string.

The energy harvesters associated with each sensing module may generate electrical energy based on one of triboelectric effect, piezoelectric effect, and magnetostrictive effect. Each of the sensing modules may include an energy storage to store the electrical energy generated by the energy harvesters. The at least one sensor in each sensing module may be coupled to receive electrical power from the energy storage associated with the sensing module. Each of the sensing modules may include at least one communication device for transmitting and receiving signals. The system may include at least one memory capsule that is movable in a stream of drilling fluid. The at least one memory capsule may have characteristics to communicate with at least one of the sensing modules and receive data from the at least one of the sensing modules. The at least one memory capsule may have at least one of a size and flexibility to pass through a nozzle of the drill bit.

A method includes disposing a plurality of sensing modules along a length of the drill string such that rotation of the drill string produces a relative rotation between an outer structure body and an inner structure body of each sensing module. The method includes disposing the drill string with the sensing modules in a wellbore. The method includes rotating the drill string to drill the wellbore and cause relative rotation between the outer structure body and inner structure body of each sensing module. The method includes producing mechanical energy in each sensing module by ball elements of the sensing module that physically interact with movable elements of the sensing module as a result of the relative rotation between the outer structure body and the inner structure body of the sensing module. The method includes converting the mechanical energy to electrical energy by energy harvesters in the sensing modules.

The method may include measuring one or more parameters in the wellbore by at least one sensor in each sensing module. The method may include storing the electrical energy in an energy storage in each sensing module and powering the at least one sensor in each sensing module with at least a portion of the electrical energy stored in the energy storage of the respective sensing module. The method may include storing data outputted by the at least one sensor in each sensing module in a memory of the sensing module. The method may include transmitting at least a portion of the data stored in each sensing module to a surface location. The act of transmitting at least a portion of the data stored in each sensing module to a surface location may include relaying signals carrying the at least a portion of the data from one sensing module to another sensing module along the length of the drill string. The method may include wirelessly receiving at least a portion of the data stored in at least one of the sensing modules by at least one memory capsule moving through an annulus formed between the wellbore and the drill string. The method may include generating a snapshot of the data stored in the memory of the at least one of the sensing modules. The act of wirelessly receiving at least a portion of the data stored in at least one of the sensing modules by at least one memory capsule may include wirelessly receiving the snapshot of the data. The method may include deploying the at least one memory capsule into the annulus from a surface location. The act of deploying the at least one memory capsule into the annulus from the surface location may include disposing the at least one memory capsule into a drilling fluid and pumping the drilling fluid through the drill string into the wellbore.

An apparatus includes a structure arrangement including an outer structure body having a cavity and an inner structure body rotatably supported within the cavity. The outer structure body and the inner structure body are separated by a gap. The inner structure body has a central bore. A plurality of ball elements are disposed in the gap and movable along a predetermined path defined in the gap in response to a relative motion between the inner structure body and the outer structure body. A plurality of movable elements are positioned to physically interact with the plurality of ball elements as the plurality of ball elements move along the predetermined path. A plurality of energy harvesters positioned to generate electrical energy from mechanical energy produced by the physical interaction between the ball elements and the movable elements.

The plurality of energy harvesters may generate electrical energy based on one of triboelectric effect, piezoelectric effect, and magnetostrictive effect. The apparatus may include an energy storage to store the electrical energy and at least one sensor to be powered from the energy storage. The energy storage and the at least one sensor may be carried by, or coupled to, the outer structure body. The apparatus may include at least one communication device for transmitting and receiving signals. The at least one communication device may be carried by, or coupled to, the outer structure body.

The foregoing general description and the following detailed description are exemplary of the invention and are intended to provide an overview or framework for understanding the nature of the invention as it is claimed. The accompanying drawings are included to provide further understanding of the invention and are incorporated in and constitute a part of the specification. The drawings illustrate various embodiments of the invention and together with the description serve to explain the principles and operation of the invention.

BRIEF DESCRIPTION OF DRAWINGS

The following is a description of the figures in the accompanying drawings. In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and have been solely selected for ease of recognition in the drawing.

DETAILED DESCRIPTION

Figure 1:
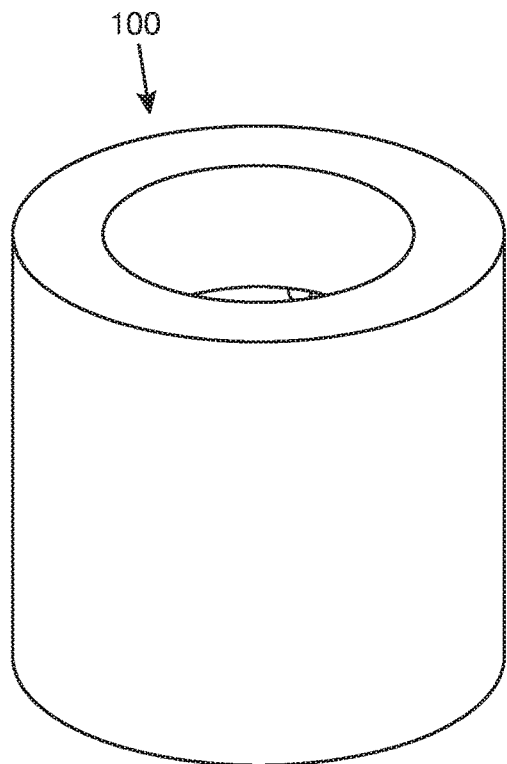
FIG. 1 is a perspective view of a self-powered sensing module (SPSM).

In this detailed description, certain specific details are set forth in order to provide a thorough understanding of various disclosed embodiments and implementations. However, one skilled in the relevant art will recognize that embodiments and implementations may be practiced without one or more of these specific details, or with other methods, components, materials, and so forth. In other instances, well known features or processes associated with drilling environments have not been shown or described in detail to avoid unnecessarily obscuring the description of the embodiments and implementations. For the sake of continuity, and in the interest of conciseness, the same or similar reference characters may be used for the same or similar objects in multiple figures.

Embodiments of a self-powered sensing module (SPSM) are described. The SPSM is capable of exploiting the rotation of a drill string during drilling of a wellbore and harvesting resulting energies to generate electricity to power downhole sensors and instrumentation. As a result, the SPSM is able to acquire information about the surrounding geological formations and directional data of the wellbore during drilling. The SPSM provides advantages over current downhole power generation methods such as batteries and turbines with respect to size, cost, mobility, temperature and pressure tolerance, and potential downhole applications. The design of the SPSM takes into account current challenges of automation and digitization in drilling and the Fourth Industrial Revolution (4IR) since, for example, the current battery technology cannot power the industrial Internet-of-Things (IoT) at scale. Since the SPSM is self-powered, multiple SPSMs can be placed along the length of the drill string for distributed sensing of downhole parameters while drilling. By deploying multiple SPSMs along the drill string, a real-time profile of the wellbore can be obtained during the drilling process. Such real-time data profiles will enable drilling operations to take advantage of emerging technologies aligned with the 4IR, such as big data analytics and artificial intelligence, to transform these data into high-value, actionable insights.

Figure 2:
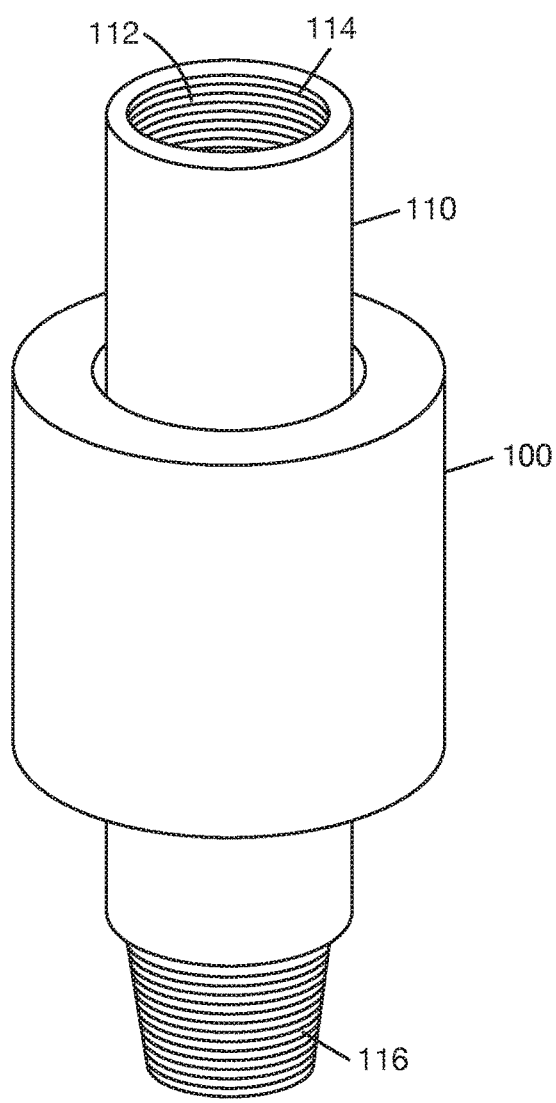
FIG. 2 is a perspective view of the SPSM of FIG. 1 attached to a crossover sub.

FIG. 1 shows SPSM 100 for downhole drilling environments. Various implementations of SPSM 100 are shown in FIGS. 4, 8, 11, 12, 14, 16, and 18. FIG. 2 shows that SPSM 100 may be attached to a crossover sub 110, which has a central bore 112 for passage of fluids and tools and threaded end connections 114, 116 that would allow SPSM 100 to be placed along a drill string by simply making up threaded connections with drill pipes in the drill string. Crossover sub 110 is shown with threaded end connection 114 as a box-type connection and threaded end connection 116 as a pin-type connection. However, SPSM 100 is not limited to this type of crossover sub. Other crossover subs with box-type connections at both ends or with pin-type connections at both ends may be used with SPSM 100. In the example shown in FIG. 2, SPSM 100 is shown on the outside of crossover sub 110. An alternative is to mount SPSM 100 inside a crossover sub.

Figure 3:
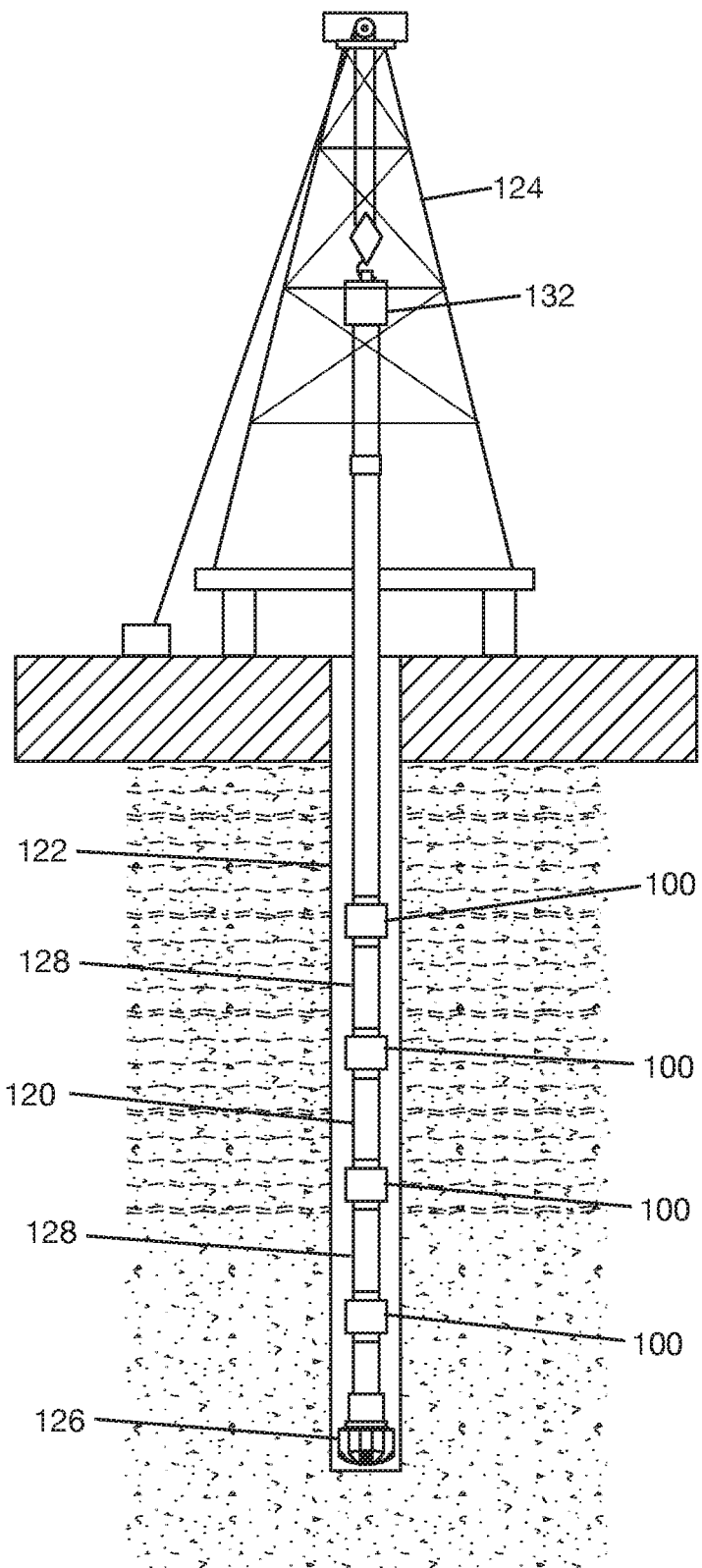
FIG. 3 is a schematic diagram of a drilling system and multiple SPSMs placed along a drill string.

For illustration purposes, FIG. 3 shows multiple SPSMs 100 placed along a drill string 120 to allow distributed sensing of downhole parameters while drilling. Drill string 120 is suspended in a wellbore 122 from a derrick 124. Drill string 120 includes a drill bit 126 to cut rock formations and drill pipes 128 connected to form a conduit. Drill pipes 128 can interface with the crossover subs (110 in FIG. 2) attached to SPSMs 100. Drill string 120 may have several other tools not specifically mentioned but known in the art. Drill string 120 may be rotated within wellbore 122 by a top drive 132 (or by a rotary table on a rig floor in other implementations), which will result in rotation of drill bit 126, enabling drill bit 126 to advance cutting of the rock formation. As drill string 120 is rotated, a structure of each SPSM 100 that is coupled to drill string 120 via the crossover sub also rotates. Energy harvesters in SPSM 100 convert the mechanical energy from the rotation of the drill string into electrical energy. The energy harvesters may be triboelectric energy harvesters based on applying friction between two materials with opposed electron affinities, piezoelectric energy harvesters based on applying mechanical stresses to piezoelectric materials, or magnetostrictive energy harvesters based on applying mechanical stresses to magnetostrictive materials.

Figure 4:
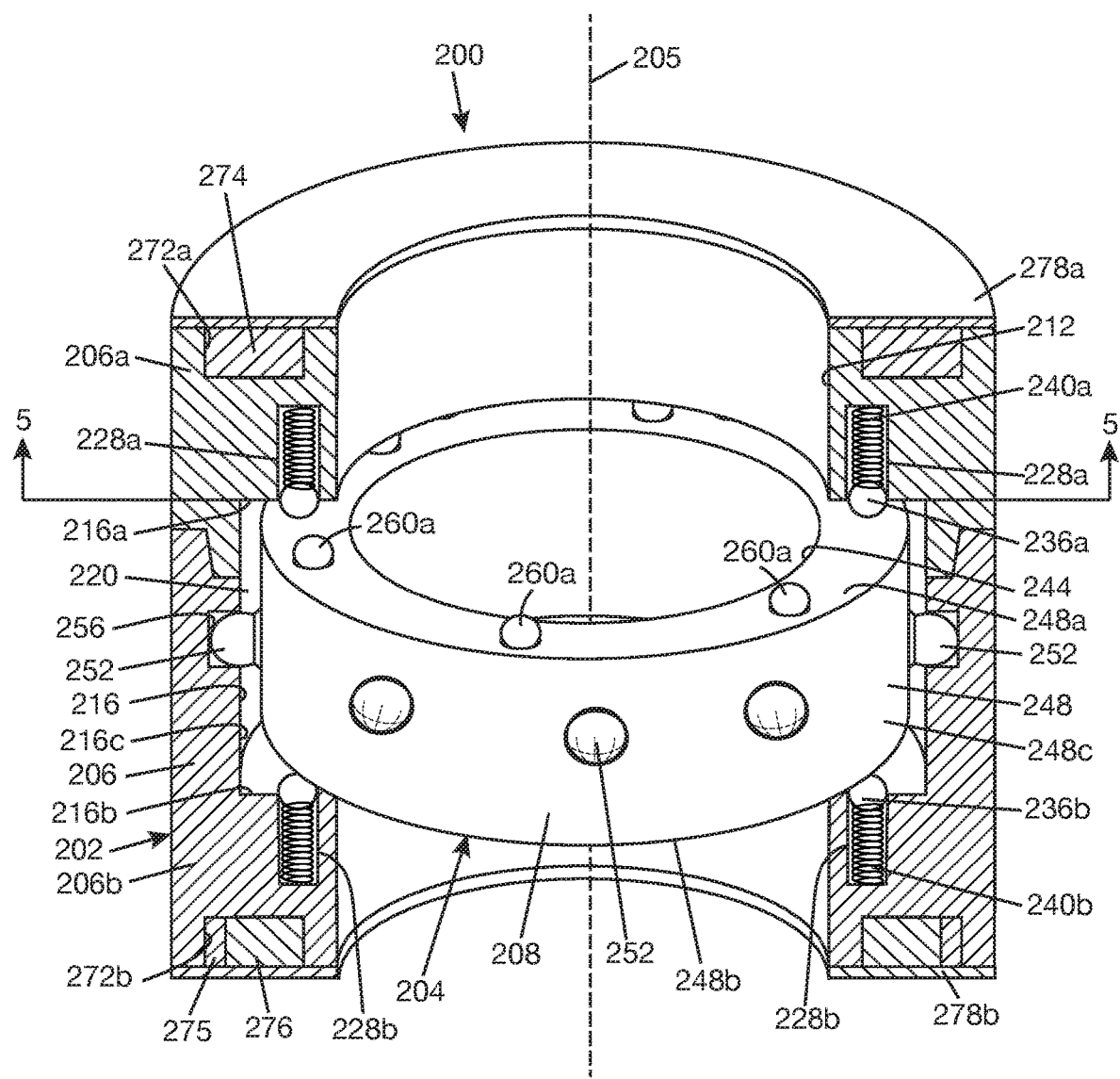
FIG. 4 is a partial cutaway view of one implementation of the SPSM with triboelectric energy harvesters.

FIG. 4 shows an exemplary SPSM 200 employing triboelectric energy harvesters to generate electricity. SPSM 200 can be used as SPSM 100 in FIGS. 1-3. SPSM 200 includes a pipe-in-pipe structure having an outer structure 202 and an inner structure 204 that is disposed within outer structure 202. Inner structure 204 is rotatable relative to outer structure 202 about a rotational axis 205. Rotational axis 205 may be an axial axis of the pipe-in-pipe structure. In one implementation, inner structure 204 may be the part of the SPSM that is coupled to a drill string (120 in FIG. 3), e.g., via a crossover sub (110 in FIG. 2), so that rotation of the drill string is transferred to inner structure 204. Outer structure 202 includes an outer structure body 206 with a central bore 212, which may have an axial axis that is aligned with rotational axis 205. Outer structure body 206 has an inner surface 216 that defines a cavity 220, which intersects central bore 212. Cavity 220 may be coaxial with central bore 212. Inner structure 204 is disposed within cavity 220. Inner surface 216 of outer structure body 206 is made of an inner top surface 216a, an inner bottom surface 216b that is in opposing relation to inner top surface 216a, and an inner side surface 216c connecting inner top surface 216a to inner bottom surface 216b. Inner top surface 216a and inner bottom surface 216b are annular in shape, and inner side surface 216c is cylindrical in shape.

Inner structure 204 includes an inner structure body 208 with a central bore 244 extending in the same direction as central bore 212 of outer structure body 206. Central bore 244 of inner structure body 208 may be coaxial with central bore 212 of outer structure body 206. Inner structure body 208 has an outer surface 248 that is in opposing relation to and spaced apart from inner surface 216 of outer structure body 206. Outer surface 248 is made of an outer top surface 248a, an outer bottom surface 248b that is in opposing relation to outer top surface 248a, and an outer side surface 248c that connects outer top surface 248a to outer bottom surface 248b. Outer top surface 248a and outer bottom surface 248b are annular in shape, and outer side surface 248c is cylindrical in shape. Outer top surface 248a of inner structure body 208 and inner top surface 216a of outer structure body 206 are in opposing relation and separated by a gap. Outer bottom surface 248b of inner structure body 208 and inner bottom surface 216b of outer structure body 206 are in opposing relation and separated by a gap. Outer side surface 248c of inner structure body 208 and inner side surface 216c of outer structure body 206 are in opposing relation and separated by a gap.

Bearing members 252 are placed between inner structure body 208 and outer structure body 206 and support rotation of inner structure body 208 relative to outer structure body 206. Bearing members 252 may be rolling contact bearing members. In the implementation illustrated in FIG. 4, bearing members 252 are bearing balls (or spherical balls). In other implementations, bearing members 252 could be rollers. In one example, bearing members 252 are disposed along an outer circumference of inner structure body 208 and retained on outer side surface 248c of inner structure body 208. A guide channel 256 is formed in inner side surface 216c of outer structure body 206. Guide channel 256 runs along an inner circumference of outer structure body 206 and corresponds in location to the outer circumference of inner structure body 208 where bearing members 252 are located. Guide channel 256 receives bearing members 252 and guides movement of bearing members 252 along a circular path as inner structure 204 rotates relative to outer structure 202. Bearing members 252 are expected to have negligible friction with the surface of guide channel 256 so that outer structure 202 remains relatively stationary while inner structure 204 rotates with the drill string. Outer structure body 206 and inner structure body 208 may be made of any low friction material that can operate at high temperatures, e.g., greater than 150° C., and at high pressures, e.g., greater than 5000 psi. Preferably, the materials of outer structure body 206 and inner structure body 208 have high abrasion and wear resistance. The materials may be metallic, non-metallic, or composite. Moreover, the materials of outer structure body 206 and inner structure body 208 may be the same or may be different.

Figure 5:
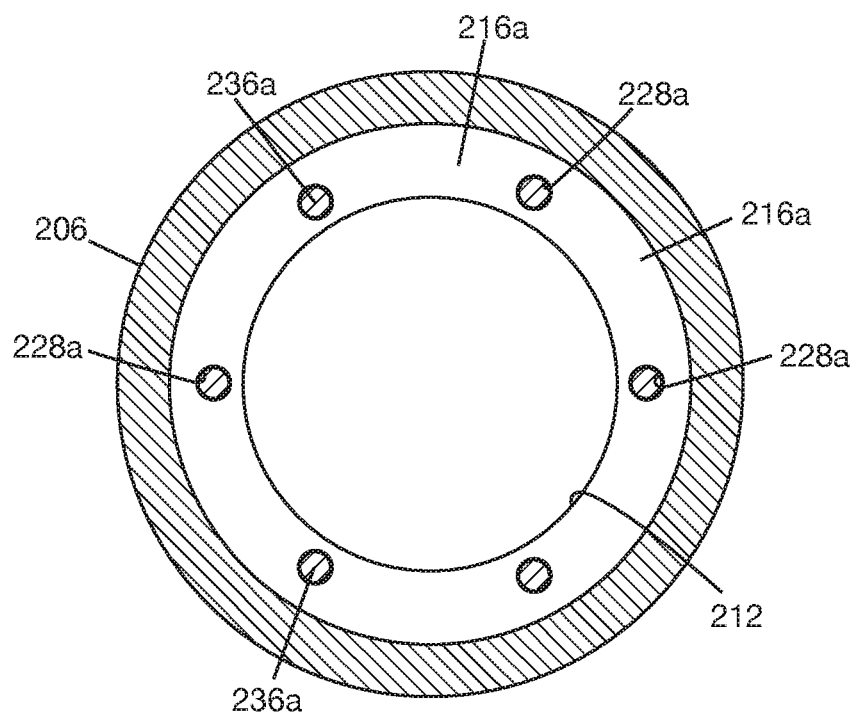
FIG. 5 is a cross-section of the SPSM of FIG. 4 along line 5-5.

Grooves 228a are formed in a top portion 206a of outer structure body 206. Grooves 228a extend to and have openings at inner top surface 216a. Although only two grooves 228a are visible in FIG. 4, there will typically be several more grooves 228a (for example, FIG. 5 shows six grooves 228a, and there may be still more grooves 228a than shown in FIG. 5). Movable elements 236a are disposed in grooves 228a. Each movable element 236a is coupled to outer structure body 206. For example, a spring 240a may be used to attach each movable element 236a to an end wall of the respective groove 228a. The attachment of spring 240a to movable element 236a allows movable element 236a to be displaced relative to outer structure body 206 and in particular along the length of the respective groove 228a. In one implementation, in a home position of spring 240a, at least a portion of movable element 236a extends through the opening of the respective groove 228a into the gap between inner top surface 216a of outer structure body 206 and outer top surface 248a of inner structure body 208. Spring 240a biases movable element 236a in a direction towards outer top surface 248a of inner structure body 208, i.e., in a direction out of respective groove 228a. As shown in FIG. 5, openings of grooves 228a form a circular pattern on inner top surface 216a of outer structure body 206. Movable elements 236a, which are disposed in grooves 228a and are extendible through the openings of grooves 228a, are also arranged in this circular pattern. In one example, as shown in FIG. 4, each movable element 236a has a spherical shape. In general, each movable element 236a may have a shape to provide a convex contact surface for interaction with ball elements 260a on inner structure body 208.

Returning to FIG. 4, grooves 228b are formed in a bottom portion 206b of outer structure body 206. Grooves 228b have openings on inner bottom surface 216b. Although only two grooves 228b are visible in FIG. 4, there will typically be several more grooves 228b. In some examples, the number of grooves 228b may the same as the number of grooves 228a. Movable elements 236b are disposed in grooves 228b. Each movable element 236b is coupled to outer structure body 206. For example, a spring 240b may be used to attach each movable element 236b to a bottom wall of the respective groove 228b. The attachment of spring 240b to movable element 236b allows movable element 236b to be displaced relative to outer structure body 206 and in particular along the length of the respective groove 228b. In one implementation, in a home position of spring 240b, at least a portion of movable element 236b extends through the opening of the respective groove 228b into the gap between inner bottom surface 216b of outer structure body 206 and outer bottom surface 248b of inner structure body 208. Spring 240b biases movable element 236b in a direction towards outer bottom surface 248b of inner structure body 208, i.e., in a direction out of respective groove 228b. Openings of grooves 228b form a circular pattern on inner bottom surface 216b (similar to what is shown in FIG. 5 for openings of grooves 228a on inner top surface 216a). Movable elements 236, which are disposed in grooves 228b and are extendible through the openings of grooves 228b, are also arranged in this circular pattern. In one example, each movable element 236b has a spherical shape. In general, each movable element 236b may have a shape to provide a convex contact surface for interaction with ball elements 260b on inner structure body 208.

Figure 6:
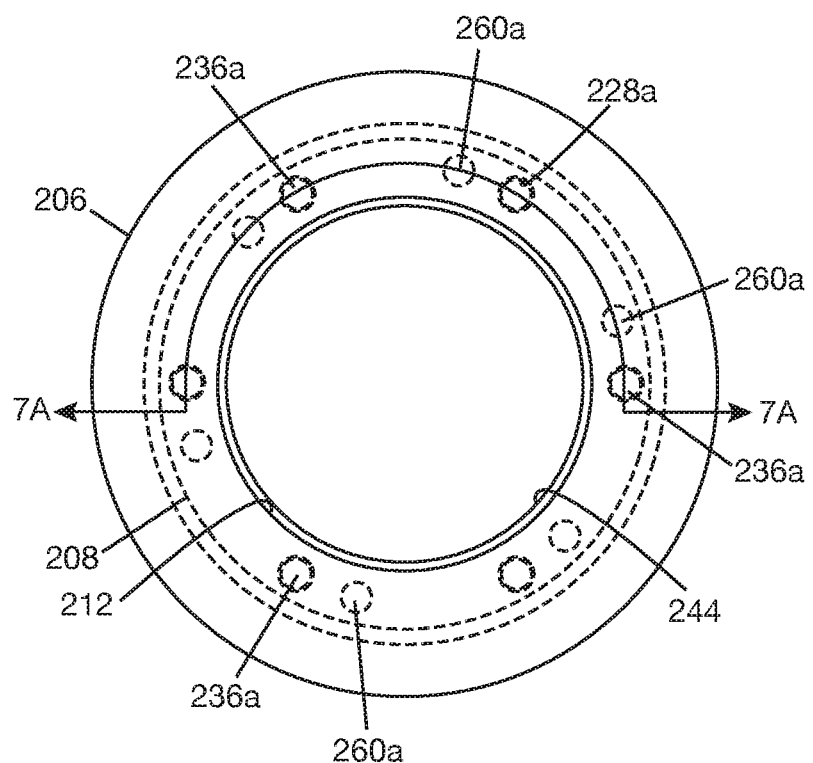
FIG. 6 is a top end view of the SPSM of FIG. 4.
Figure 7A:
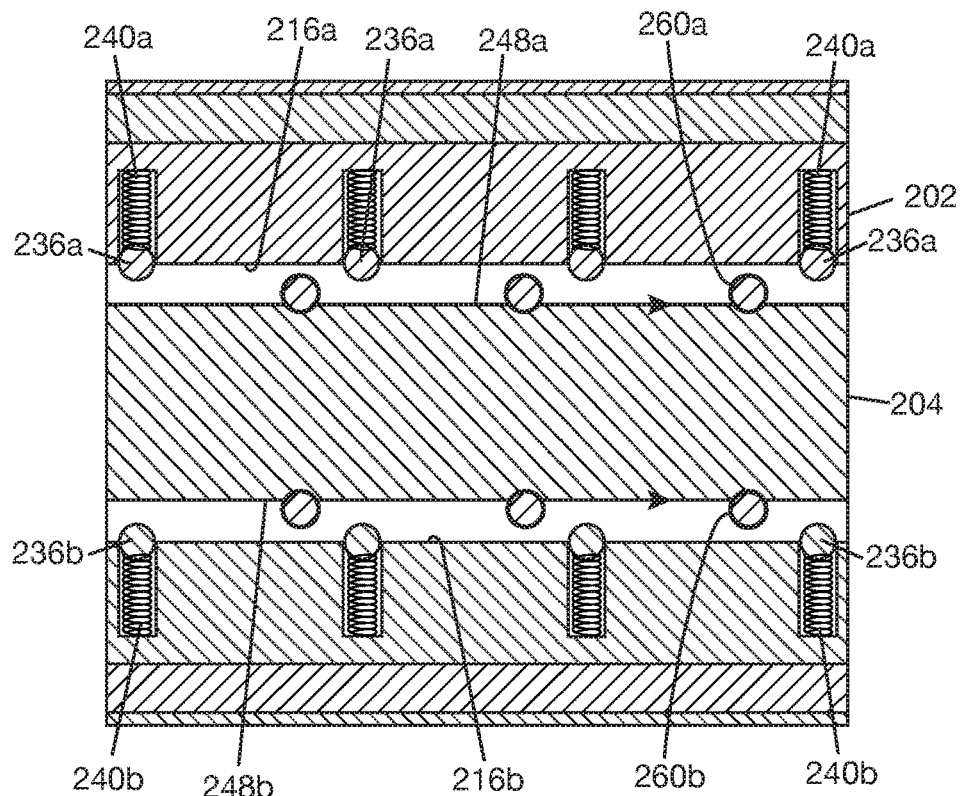
FIGS. 7A-7D show cross-sections of the SPSM of FIG. 4 at different rotational states, taken generally along curved line 7A-7A in FIG. 6, with the curved cross-section flattened out for ease of illustration.

Ball elements 260a are placed along and retained on outer top surface 248a of inner structure body 208. In one example, ball elements 260a have a spherical shape. In general, each ball element 260a may have a shape to provide a convex contact surface for interaction with movable elements 236a on outer structure body 206. Ball elements 260a form a circular pattern on outer top surface 248a. FIG. 6 shows that the circular pattern formed by ball elements 260a coincides with the circular pattern formed by movable elements 236a. Returning to FIG. 4, ball elements (not visible in FIG. 4) are placed along and retained on outer bottom surface 248b of inner structure body 208 in the same manner described for ball elements 260a and outer top surface 248a. Referring to FIG. 7A, the height of the gap between inner top surface 216a of outer structure body 206 and outer top surface 248a of inner structure body 208, the extent to which each movable element 236a projects into the gap when the respective spring 240a is in the home position, and the extent to which each ball element 260a projects into the gap can be selected such that ball elements 260a will come into contact with movable elements 236a as inner structure 204 rotates relative to outer structure 202. Similarly, the height of the gap between inner bottom surface 216b of outer structure body 206 and outer bottom surface 248b of inner structure body 208, the extent to which each movable element 236b projects into the gap when the respective spring 240b is in the home position, and the extent to which each ball element 260b projects into the gap can be selected such that ball elements 260b will come into contact with movable elements 236b as inner structure 204 rotates relative to outer structure 202.

Figure 7B:
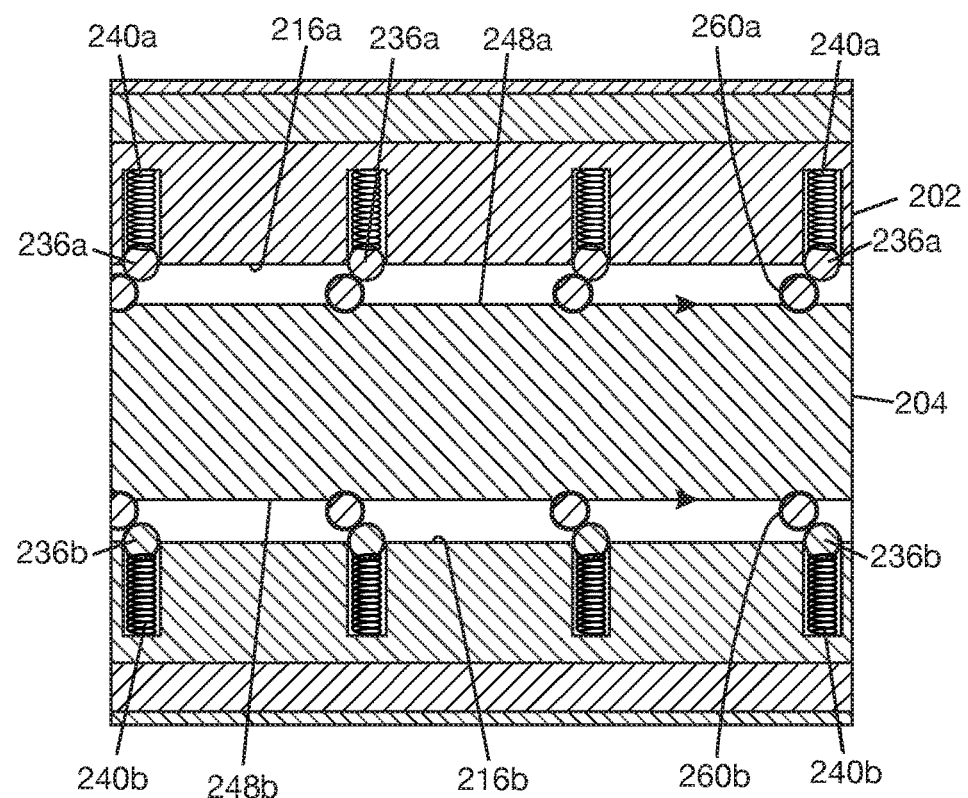
Figure 7C:
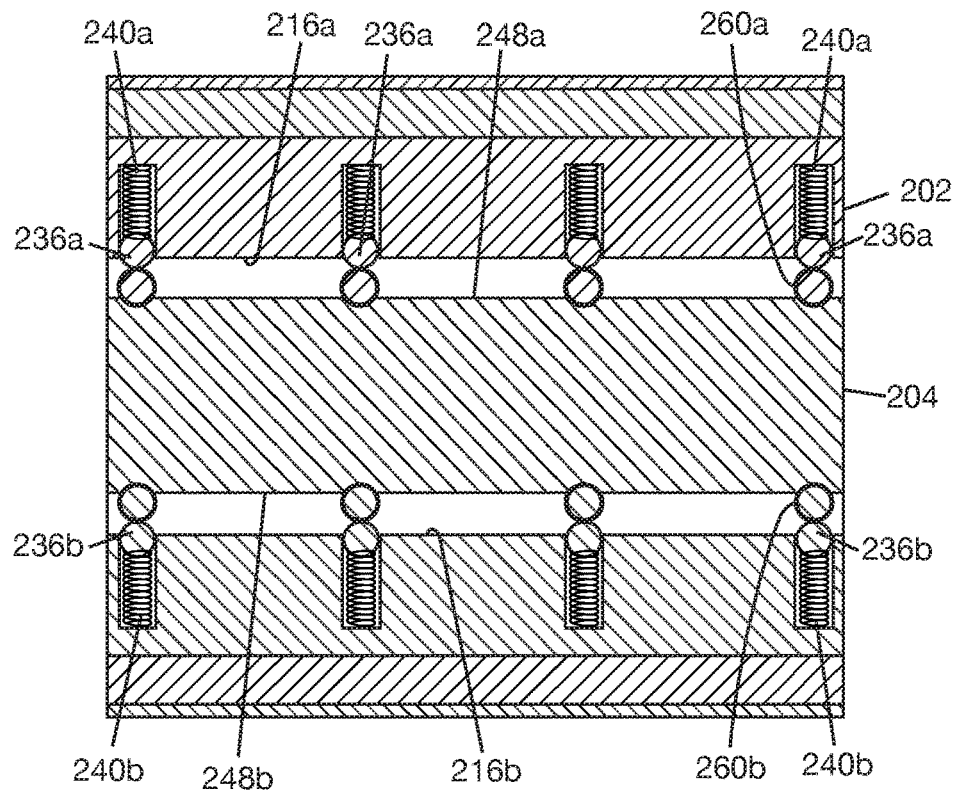
Figure 7D:
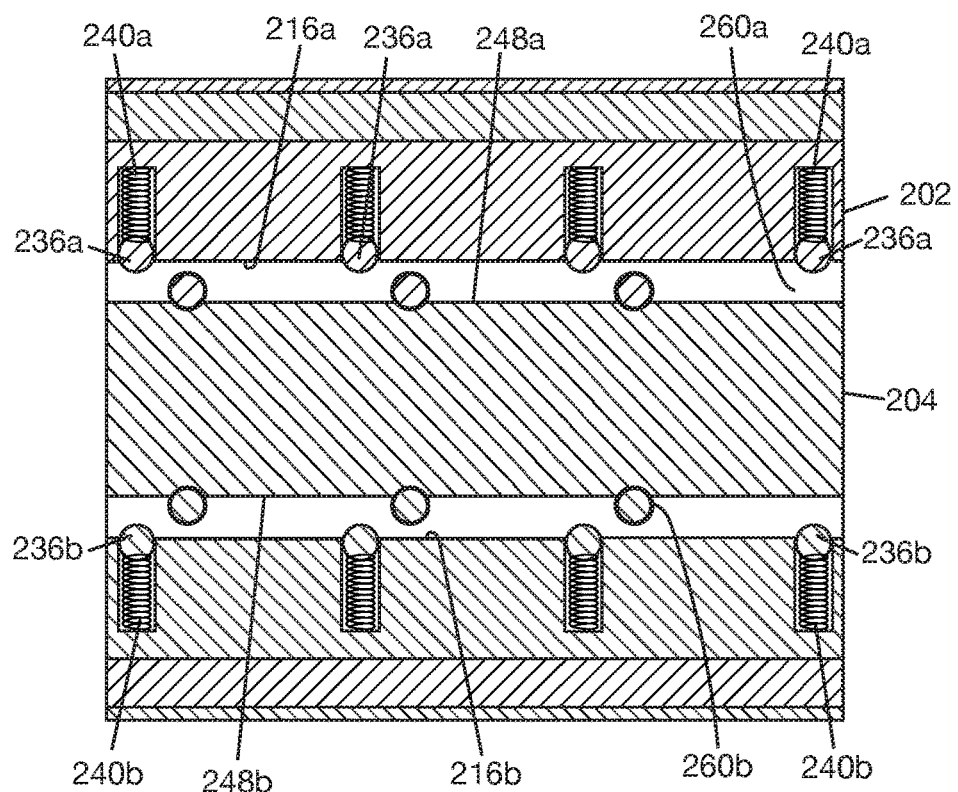

FIG. 7A shows a state where "top" ball elements 260a are approaching "top" movable elements 236a and "bottom"

ball elements 260*b* are approaching bottom" movable elements 236*b*. As inner structure 204 rotates relative to outer structure 202, top ball elements 260*a* will come into contact with top movable elements 236*a*, and bottom ball elements 260*a* will come into contact with bottom movable elements 236*b*. FIGS. 7B and 7C show states where top ball elements 260*a* are in contact with top movable elements 236*a* and bottom ball elements 260*b* are in contact with bottom movable elements 236*b*. In FIG. 7C, movable elements 236*a*, 236*b* have been displaced inwardly of their respective grooves 228*a*, 228*b* to accommodate the height of ball elements 260*a*, 260*b*. While top ball elements 260*a* are in sliding contact with top movable elements 236*a*, top springs 240*a* will urge top movable elements 236*a* against top ball elements 260*a*, ensuring maximum contact between top ball elements 260*a* and top movable elements 236*a*. Similarly, while bottom ball elements 260*b* are in sliding contact with bottom movable elements 236, bottom springs 240*b* will urge bottom movable elements 236*b* against bottom ball elements 260*b*, ensuring maximum contact between bottom ball elements 260*b* and bottom movable elements 236*b*. FIG. 7D shows a state where ball elements 260*a*, 260*b* have separated again from movable elements 236*a*, 236*b*, and the movable elements have returned to their home positions. This process of ball elements 260*a*, 260*b* contacting movable elements 236*a*, 236*b* and subsequently separating from movable elements 236*a*, 236*b* continues as inner structure 204 rotates relative to outer structure 202.

Figure 8:
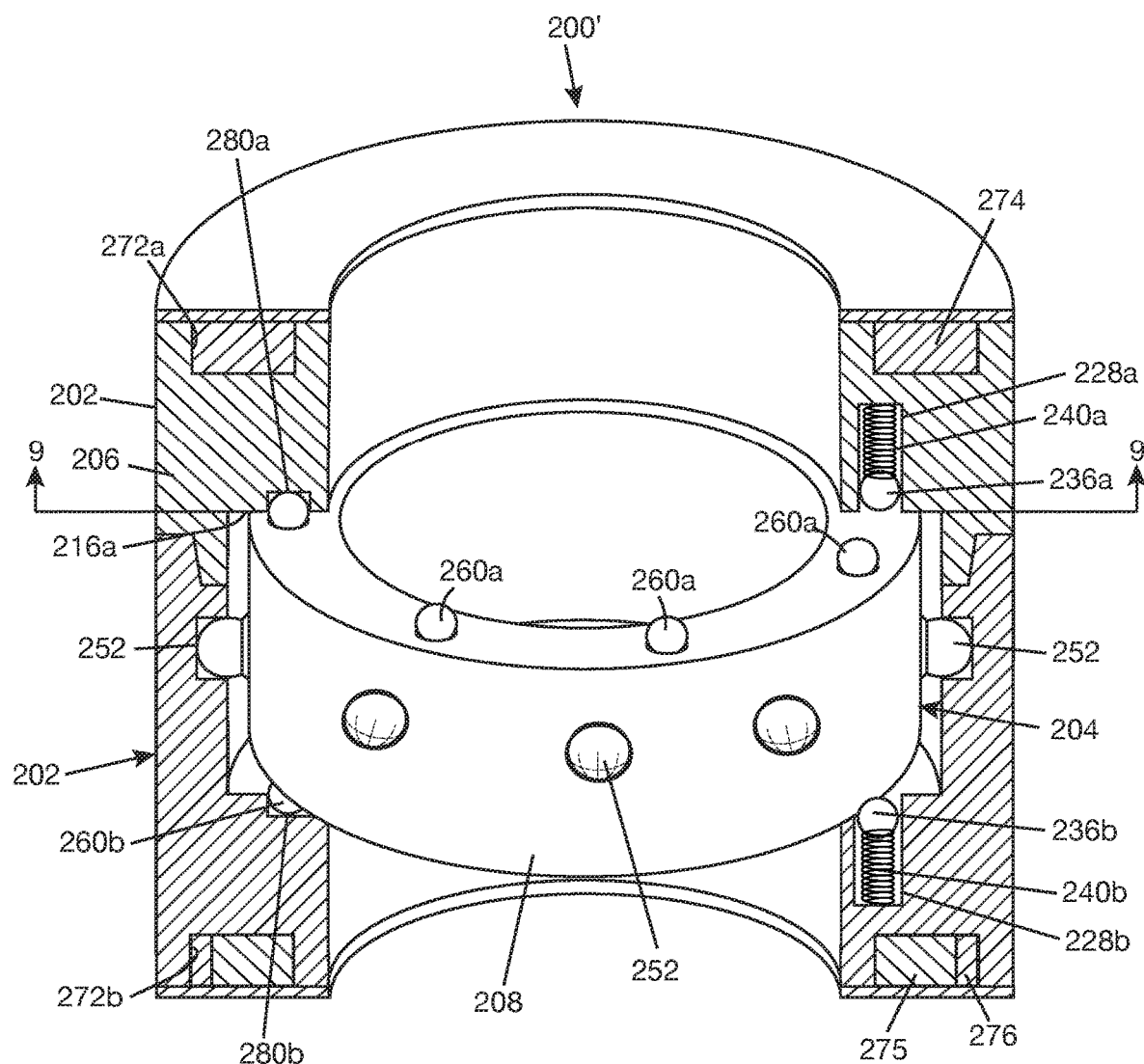
FIG. 8 is a partial cutaway view of a variation of the SPSM of FIG. 4 with energy harvesting ball elements in guide channels.
Figure 9:
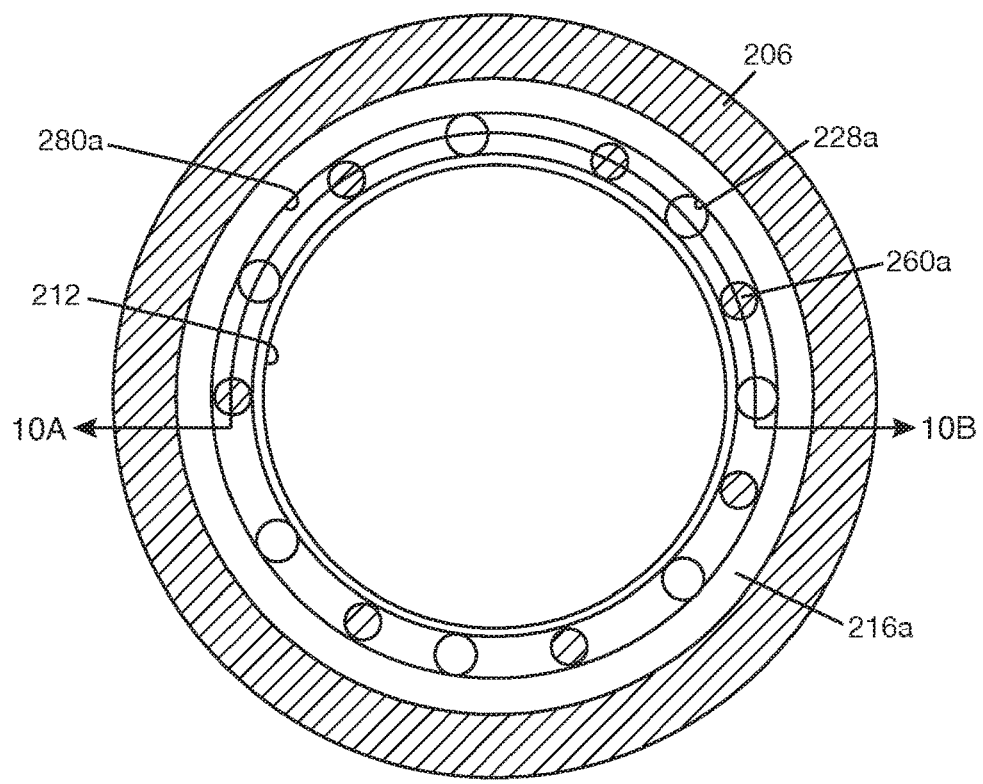
FIG. 9 is a cross-section of the SPSM of FIG. 8 along line 9-9.
Figure 10A:
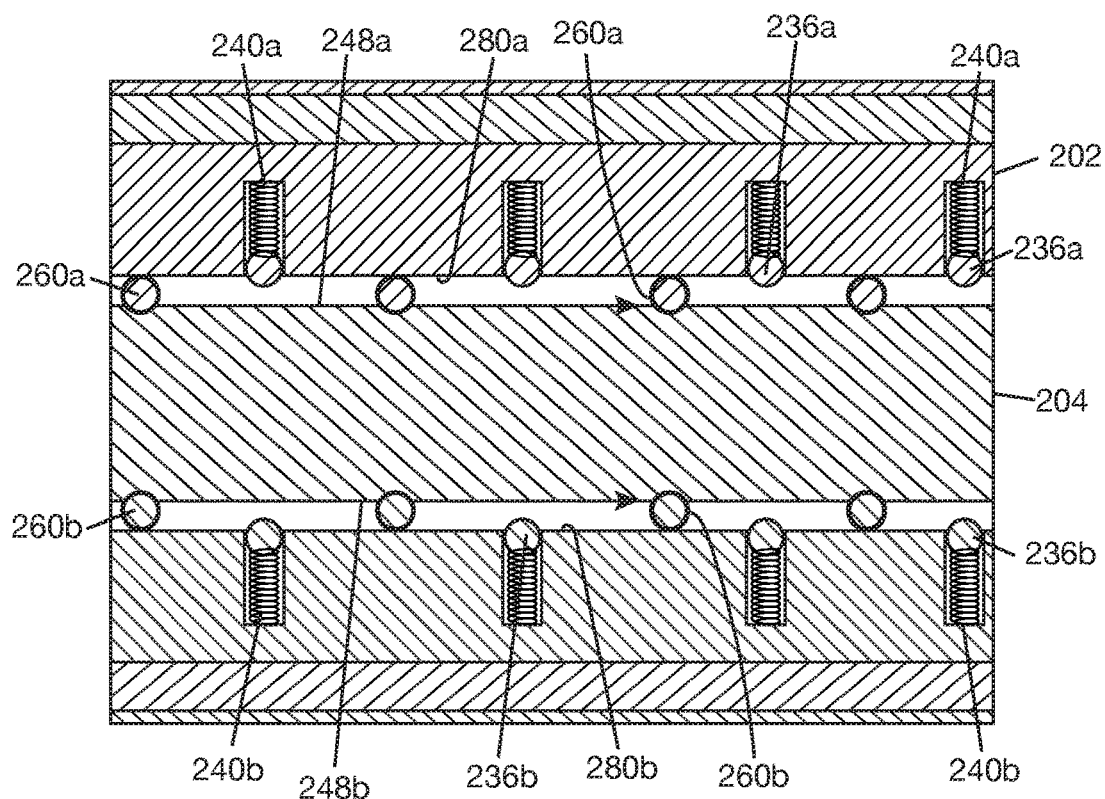
FIGS. 10A-10C show cross-sections of the SPSM of FIG. 8 at different rotational states, taken generally along curved line 10A-10A in FIG. 9, with the curved cross-section flattened out for ease of illustration.
Figure 10B:
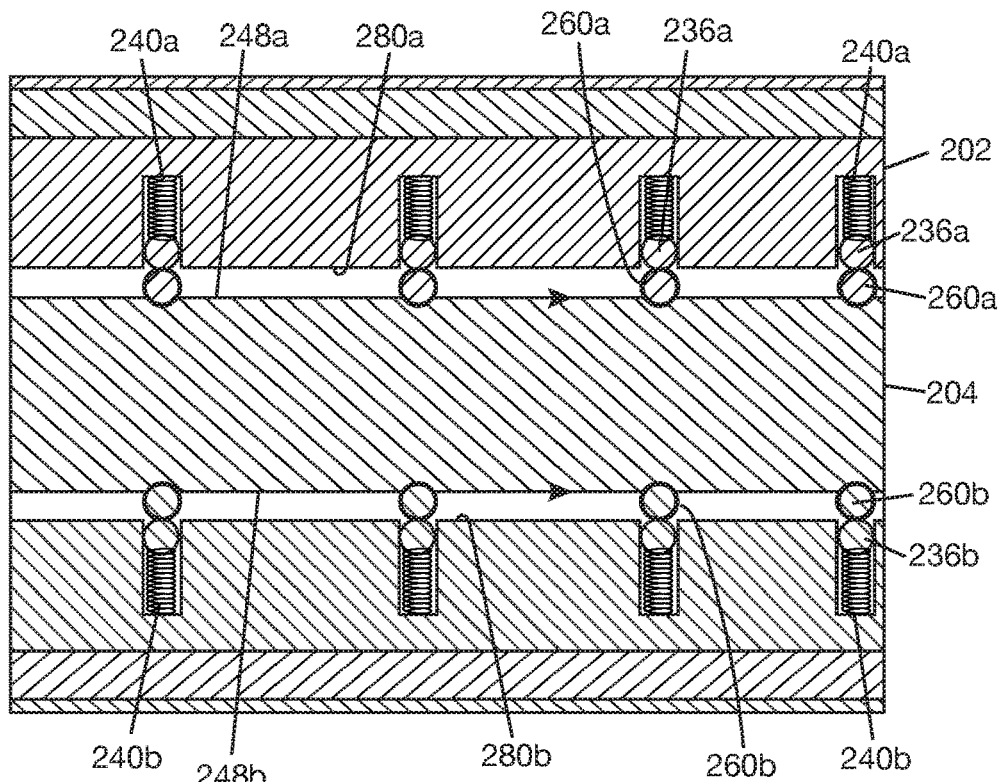
Figure 10C:
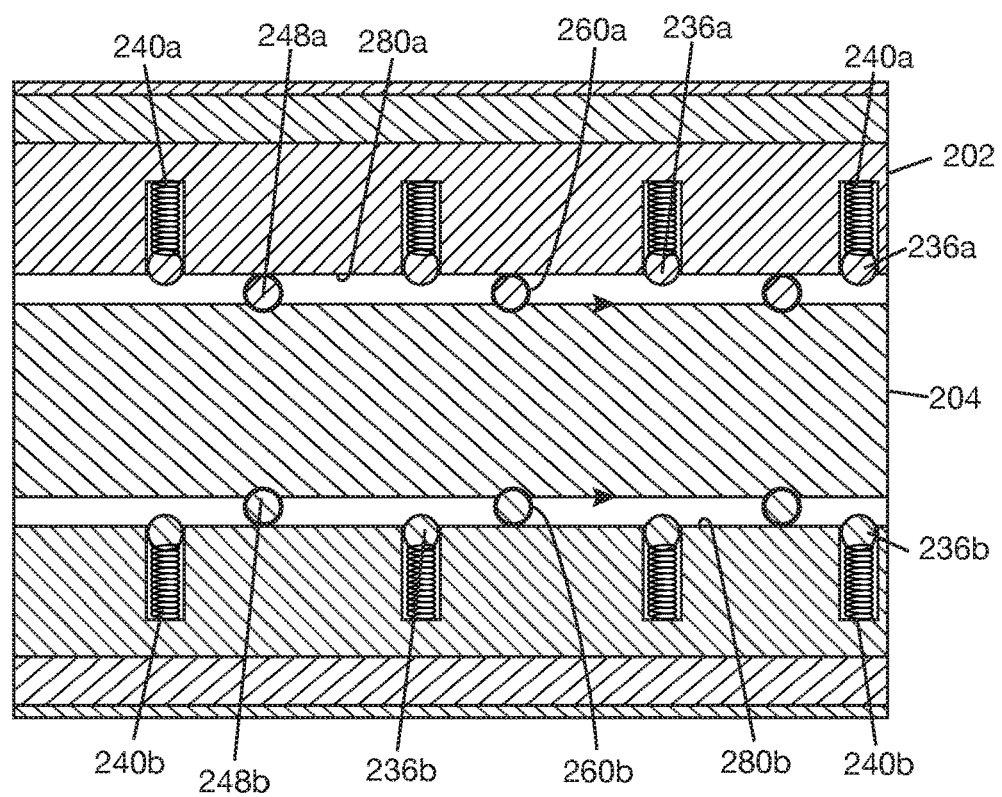

FIG. 8 shows a variant SPSM 200' where guide channels 280*a*, 280*b* are formed in inner surfaces 216*a*, 216*b* of outer structure body 206 to receive ball elements 260*a*, 260*b*, respectively. FIG. 9 shows inner top surface 216*a* with guide channel 280*a* for ball elements 260*a*. Guide channel 280*a* receives and guides ball elements 260*a* along a circular path. Grooves 228*a* intersect guide channel 280*a* to allow ball elements 260*a* to contact movable elements 236*a* in grooves 228*a* as inner structure 204 rotates relative to outer structure 202. Similarly, guide channel 280*b* (in FIG. 8) receives and guides ball elements 260*b* along a circular path. Grooves 228*b* intersect guide channel 280*b* to allow ball elements 260*b* to contact movable elements 236*b* in grooves 228*b* as inner structure 204 rotates relative to outer structure 202. FIG. 10A shows a state where ball elements 260*a*, 260*b* in guide channels 280*a*, 280*b* are approaching movable elements 236*a*, 236*b* in grooves 228*a*, 228*b* as inner structure 204 rotates relative to outer structure 202. FIG. 10B shows a state where ball elements 260*a*, 260*b* in guide channels 280*a*, 280*b* are in contact with movable elements 236*a*, 236*b* in grooves 228*a*, 228*b*. FIG. 9C shows a state where ball elements 260*a*, 260*b* in guide channels 280*a*, 280*b* are again separated from movable elements 236*a*, 236*b* in grooves 228*a*, 228*b*. In the example shown in FIG. 8, ball elements 260*a*, 260*b* provide ball bearings between inner structure 204 and outer structure 202. These ball bearings may be in addition to the bearing support provided by bearing members 252.

For discussion purposes, the term "tribo-surface" will be used to describe a surface involved in generating electricity by the triboelectric effect. To generate electricity by the triboelectric effect, two tribo-surfaces are needed—a first tribo-surface made of a first material and a second tribo-surface made of a second material. For convenience, these two materials will be labeled A and B. Materials A and B have opposite polarities or polarities that are as distant as possible. This may also be expressed as materials A and B having opposed electron affinities. Two tribo-surfaces that are involved in generating electricity by the tribo-electric effect will have opposed electron affinities. Given a set of materials with different electron affinities, the materials may be ranked in order of affinity for electrons, starting from the highest to the lowest (or vice versa). Materials A and B may be selected from opposite ends of the rank. In a non-limiting example, each of materials A and B may be selected from polyamide, polytetrafluoroethylene (PTFE), polyethylene terephthalate (PET), polydimethylacrylamide (PDMA), polydimethylsiloxane (PDMS), polyimide, carbon nanotubes, copper, silver, aluminum, lead, elastomer, Teflon, Kapton, nylon, and polyester.

In one implementation, contact surfaces of ball elements 260*a*, 260*b* and movable elements 236*a*, 236*b* act as energy harvesting elements (EHEs). In this case, EHEs are materials A and B that are disposed on at least the contact surfaces of ball elements 260*a*, 260*b* and the contact surfaces of movable elements 236*a*, 236*b*. The arrangement of the EHEs on ball elements 260*a* and movable elements 236*a* and on ball elements 260*b* and movable elements 236*b* is such that the EHEs will provide a plurality of tribo-surfaces with opposed electron affinities that will contact each other as inner structure 204 rotates relative to outer structure 202. As an example, ball elements 260*a*, 260*b* may be made of or coated with material A, and movable elements 236*a*, 236*b* may be made of or coated with material B. Material A for ball elements 260*a* may be the same or may differ from material A for ball elements 260*b*. Similarly, material B for movable elements 236*a* may be the same or may differ from material B for movable elements 236*b*.

When a ball element EHE surface with material A is rubbed against a movable element EHE surface with material B, one surface will tend to donate electrons while the other surface will accept electrons. For example, if material A is PDMS and material B is polyester, the polyester surface will tend to donate electrons, while the PDMS surface will accept electrons. If the ball element surface with material A and the movable element surface with material B are separated immediately after they are rubbed together, an air gap will be created that isolates the charge on the surface that accepted electrons, which would create oppositely charged surfaces. When a load is connected between these two oppositely charged surfaces, current will flow to equalize the charge potential. When these surfaces move toward each other again, there will be a current flow, but in the opposite direction. The cycle of contact (short circuit) and separation (open circuit) results in charges flowing in one direction and then in the opposite direction, leading to a positive and negative voltage waveform. Therefore, by bringing ball elements 260*a* (260*b*) with material A surfaces into contact with movable elements 236*a* (236*b*) with material B surfaces and then quickly separating these surfaces, alternating current (AC) can be produced. The continuity of the AC will depend on the rate at which inner structure 204 rotates relative to outer structure 202, which will depend on the rate at which the drill string rotates in downhole applications. The electrical energy generated by triboelectric effect can be used to power sensors and associated electronics in the SPSM.

Figure 11:
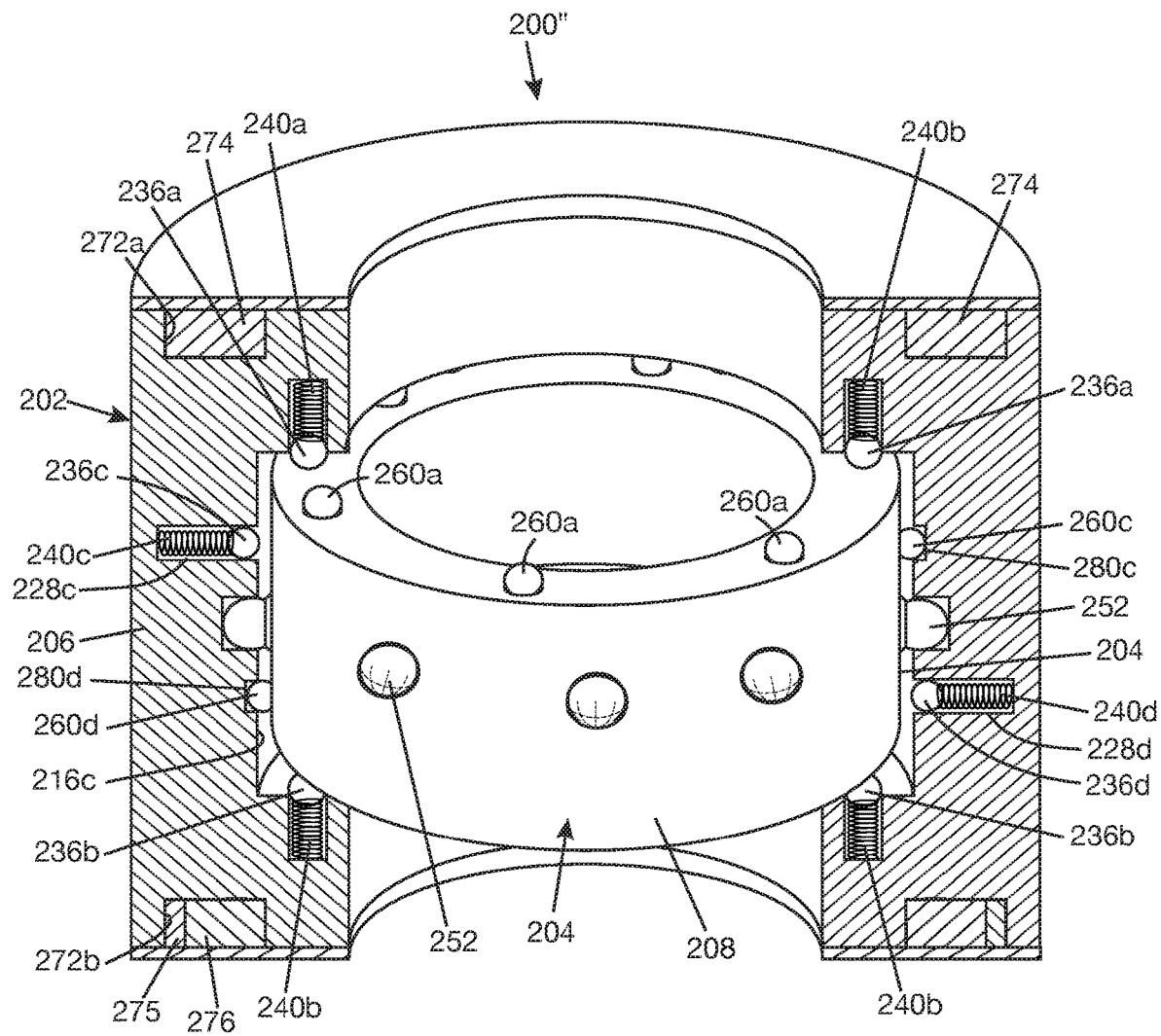
FIG. 11 shows a partial cutaway view of a variation of the SPSM of FIG. 4 with additional placement of energy harvesting ball elements and movable elements.

As can be appreciated, the more EHEs with material A and B that are involved in generating electricity, the more electricity can be generated. FIG. 11 shows a variant SPSM 200" where additional ball elements 260*c*, 260*d* and movable elements 236*c*, 236*d* are provided between inner side surface 216*c* of outer structure body and outer side surface 248*c* of inner structure body 208. EHEs with materials A and B can be disposed on ball elements 260*a*, 260*b* and movable elements 236*c*, 236*d*, respectively, to generate electricity when inner structure 204 rotates relative to outer structure 202. In the example of FIG. 11, upper ball elements 260c (only one ball element 260c is visible) and lower ball elements 260d (only one ball element 260d is visible) are positioned along and retained on outer side surface 248c of inner structure body 208. Upper movable elements 236c (only one movable element 236c is visible) and lower movable elements 236d (only one movable element 236d is visible) are positioned in grooves 228c, 228d, respectively, in outer structure body 206. Movable elements 236c, 236d are coupled to outer structure body 206 by springs 240c, 240d. Guide channels 280c, 280d may be formed in inner side surface 216c of outer structure body 206 to receive and guide motion of ball elements 260c, 260d. In this case, ball elements 260c, 260d provide ball bearings between inner structure 204 and outer structure 202. The bearing support provided by ball elements 260c, 260d may be in addition to the bearing support provided by bearing members 252. The arrangement of ball elements 260a, 260b, 260c, 260d and movable elements 236a, 236b, 236c, 236d may be such that EHE materials A and B on these ball elements and movable elements generate AC synchronously.

Figure 12:
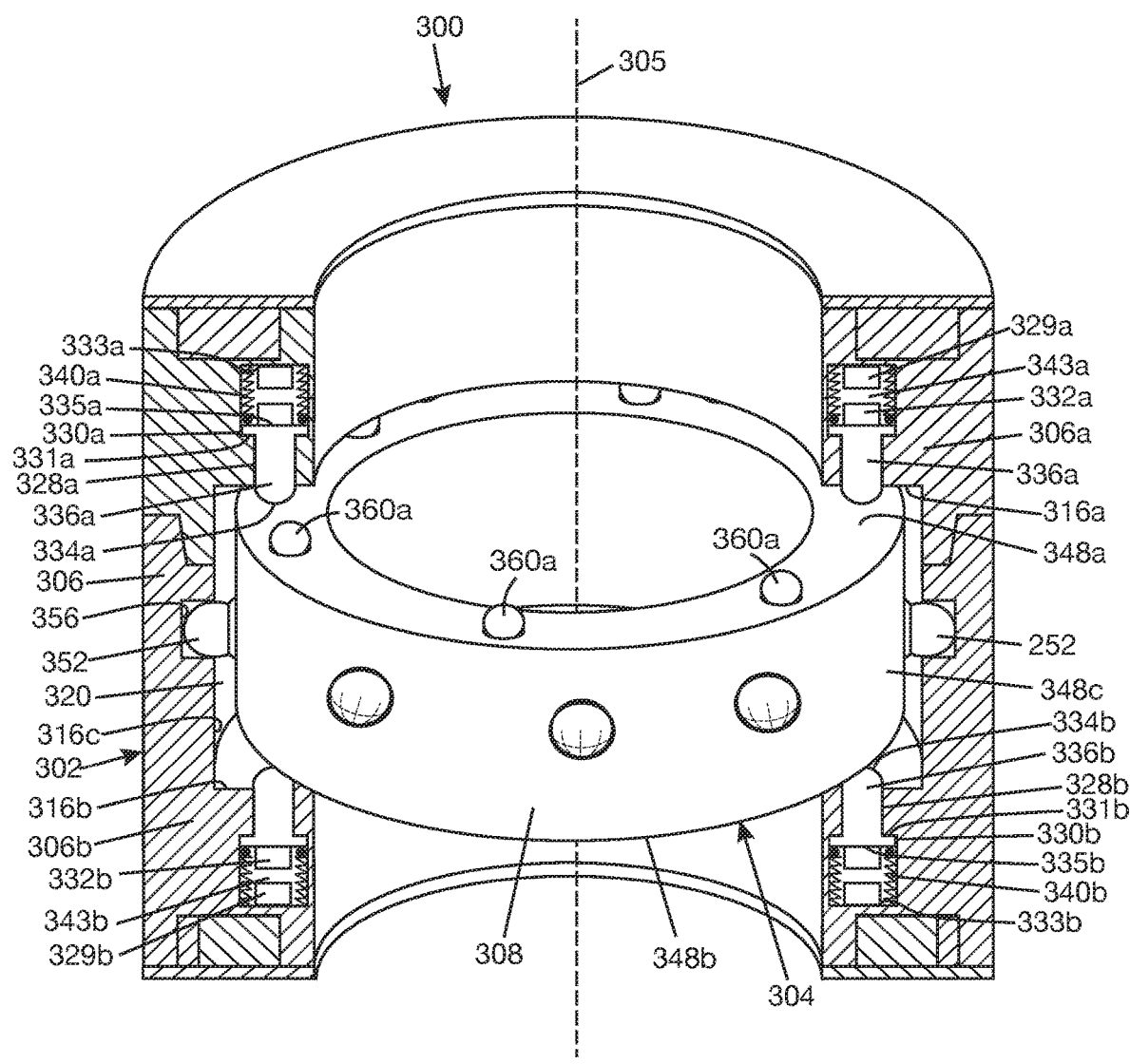
FIG. 12 is a partial cutaway view of another implementation of the SPSM of FIG. 1 with triboelectric energy harvesters.

FIG. 12 shows another exemplary SPSM 300 employing triboelectric energy harvesters to generate electricity. SPSM 300 can be used as SPSM 100 in FIGS. 1-3. SPSM 300 is similar to SPSM 200 in nearly all respects. The main difference between SPSM 300 and SPSM 200 is in the configuration of the energy harvesters used to generate electricity. SPSM 300 includes a pipe-in-pipe structure having an outer structure 302 and an inner structure 304 disposed within outer structure 302. Inner structure 304 is rotatable relative to outer structure 302 about a rotational axis 305. Rotational axis 305 may be an axial axis of the pipe-in-pipe structure. Outer structure 302 has an outer structure body 306 with a cavity 320. Inner structure 304 is disposed within cavity 320 and is rotatable within cavity 320. Inner structure 304 has an inner structure body 308. Rotation of inner structure 304 relative to outer structure 302 may be supported by bearing members 352 retained on an outer side surface 348c of inner structure body 308 and received in a mating guide channel 356 in an inner side surface 316c of outer structure body 306. Ball elements 360a are retained on a top outer surface 348a of inner structure body 308, and ball elements 360b (visible in FIGS. 13A-13C) are retained on an outer bottom surface 348b of inner structure body 308. Ball elements 360a, 360b may be arranged in circular patterns on the respective surfaces of inner structure body 308. Grooves 328a are formed in a top portion 306a of outer structure body 306 and have openings on an inner surface 316a of outer structure body 306 that is in opposing relation to outer top surface 348a of inner structure body 308. Similarly, grooves 328b are formed in a bottom portion 306b of outer structure body 306 and have openings on an inner bottom surface 316b of outer structure body 306 that is in opposing relation to outer bottom surface 348b of inner structure body 308. Movable elements 336a, 336b are disposed in grooves 328a, 328b.

Now to the difference between SPSM 300 and SPSM 200, each movable element 336a, 336b has an inner end surface 335a, 335b that is in opposing relation to end wall 333a, 333b of groove 328a, 328b and an outer end surface 334a, 334b for contacting ball element 360a, 360b on inner structure body 208. In one example, outer end surfaces 334a, 334b are convex surfaces, e.g., portions of spherical surfaces. Inner end surfaces 335a, 335b may be flat. In one example, movable elements 336a, 336b may have flanges 330a, 330b that abut shoulders (or seats) 331a, 331b in the home position (i.e., in a position where movable elements 336a, 336b are not in contact with ball elements 360a, 360b). Springs 340a, 340b may be arranged between end walls 333a, 333b and flanges 335a, 335b of movable elements 336a, 336b to restore movable elements 336a, 336b to their home positions after movable elements 336a, 336b have been displaced from shoulders (or seats) 331a, 331b by contact with ball elements 360a, 360b. Springs 340a, 340b may be arranged between end walls 333a, 333b and flanges 330a, 330b and may act to restore movable elements to their home positions after they have been displaced inwardly of grooves 328a, 328b by contact with ball elements 360a, 360b. In some cases, movable elements 336a, 336b may be suspended in grooves 328a, 328b on the ends of springs 340a, 340b without flanges on movable elements 336a, 336b abutting shoulders (or seats) in grooves 328a, 328b. In some cases, extension and retraction of springs 340a, 340b may be guided along movement tracks in grooves 328a, 328b.

Figure 13A:
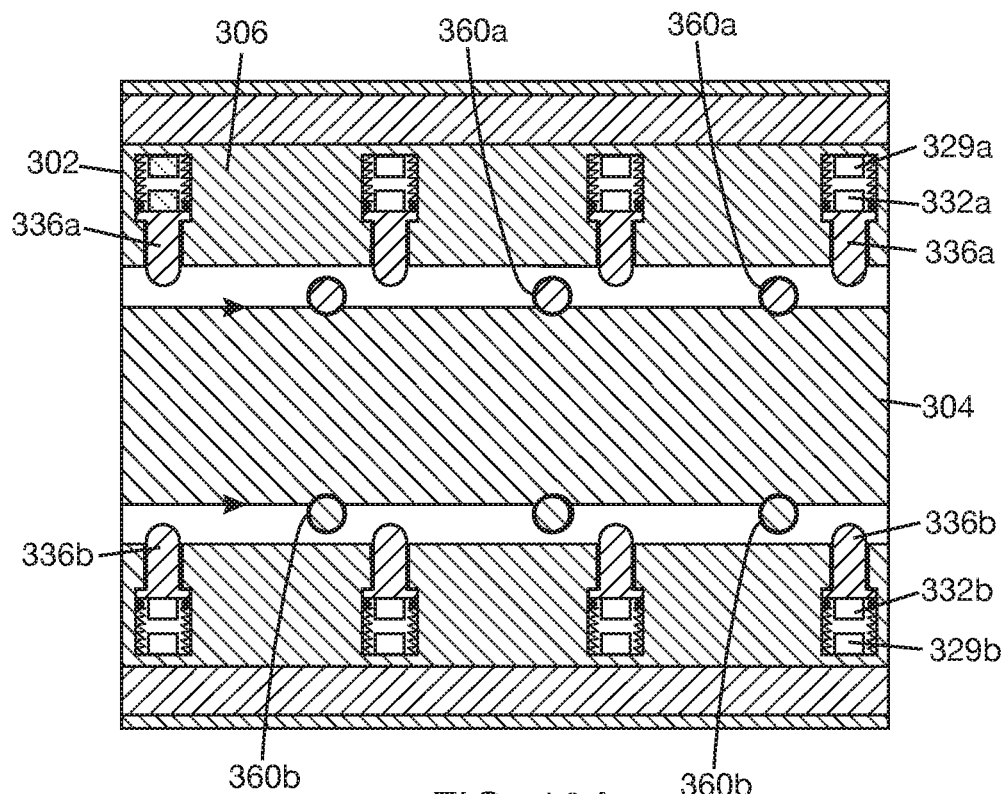
FIGS. 13A-13C show cross-sections of the SPSM of FIG. 12 at different rotational states, taken generally along a curved line similar to 10A-10A in FIG. 9, with the curved cross-section flattened out for ease of illustration.
Figure 13B:
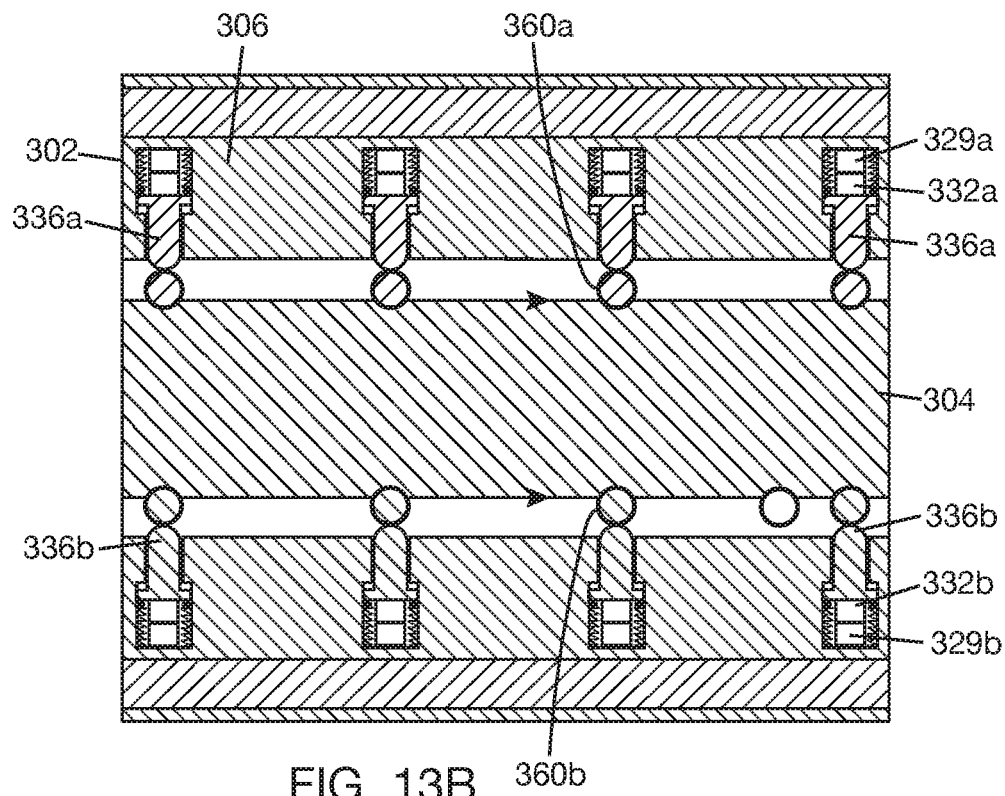
Figure 13C:
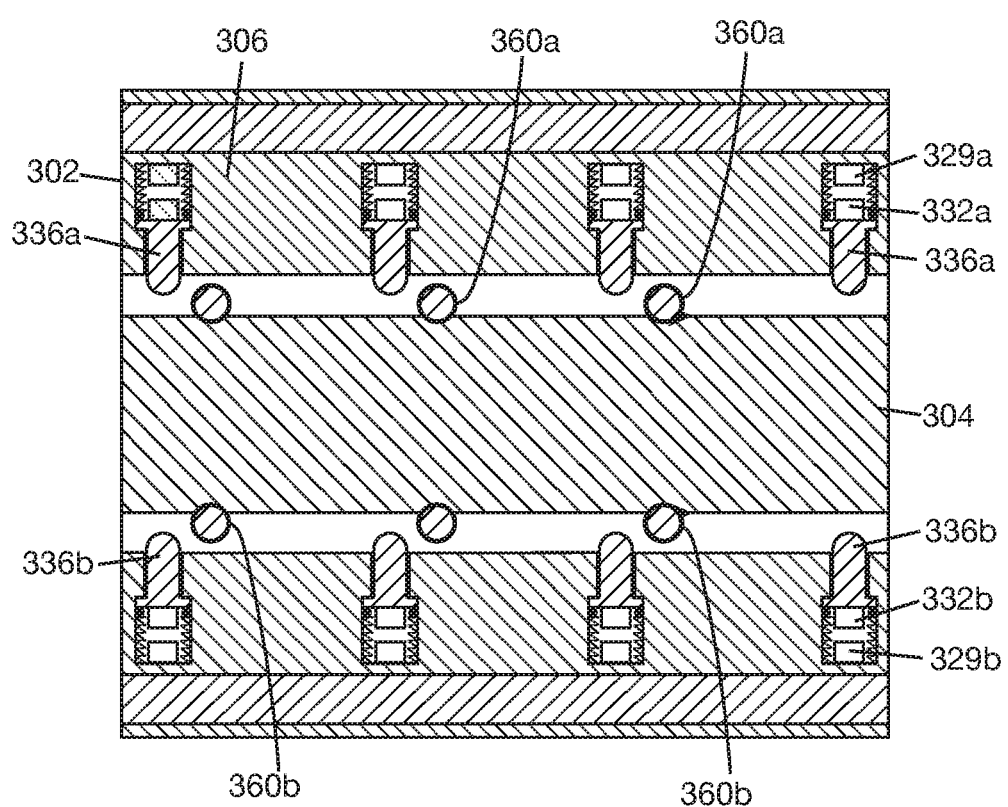

Energy harvesting elements (EHEs) 329a, 329b are disposed on end walls 333a, 333b of grooves 328a, 328b. EHEs 332a, 332b are disposed on inner end surfaces 335a, 335b of movable elements 336a, 336b. EHEs 329a, 332a, 329b, 332b may be material films or sheets applied, adhered, or otherwise attached to the respective surfaces (each EHE may have a single layer or multiple layers of material). EHEs 329a, 332b are in opposing relation within grooves 328a. Similarly, EHEs 329b, 332b are in opposing relation within grooves 328b. In the home position, EHEs 329a, 332a in each groove 328a are separated by a gap 343a, and EHEs 329b, 332b in each groove 328b are separated by a gap 343b. When ball elements 360a contact movable elements 336a, movable elements 336a are propelled into grooves 328a such that opposed EHEs 332a and 329a physically contact each other. EHEs 332a, 329a separate when ball elements 360a move away from contact with movable elements 236a. Similarly, when ball elements 360b contact movable elements 336b, movable elements 336b are propelled into grooves 328b such that opposed EHEs 332b and 329b physically contact each other. EHEs 332b, 329b separate when ball elements 360b move away from contact with movable elements 336b. FIG. 13A shows a state where ball elements 360a, 360b are approaching movable elements 336a, 336b due to rotation of inner structure 304 relative to outer structure 302. FIG. 13B shows a state where ball elements 360a, 360b are in contact with movable elements 336a, 336b. Movable elements 336a, 336b have been displaced inwardly of their respective grooves 328a, 328b compared to the state shown in FIG. 13A. Opposed EHEs 332a, 329a within grooves 328a are in contact, and opposed EHEs 332b, 329b within grooves 328b are in contact. FIG. 13C shows a state where ball elements 360a, 360b have separated again from movable elements 336a, 336b. In this state, movable elements 336a are in their home positions, and opposed EHEs 332a, 329a are no longer in contact. Similarly, movable elements 336b are in their home positions, and opposed EHEs 332a, 329a are no longer in contact. EHEs 332a and 329b are made of materials A and B as described with reference to SPSM 200, i.e., contact surfaces of EHEs 332a, 329b have opposed electron affinities. Similarly, EHEs 332b and 329b are made of materials A and B. In this implementation, EHEs 332a, 329a, 332b, 329b provide tribo-surfaces for generation of electricity by the triboelectric effect. Contact between the material A and B tribo-surfaces, followed by separation of these surfaces, will result in generation of electric charges by triboelectric effect. The electric charges can be used to power sensors and other electronics inside the SPSM.

To maximize generation of electricity, grooves with openings on an inner side surface 316c (in FIG. 12) of outer structure body 306 can be formed, movable elements can be disposed in the grooves, opposed EHEs made of materials A and B can be arranged within the grooves and between the movable elements and end walls of the grooves, a gap between the opposed EHEs can be responsive to a displacement of the movable elements relative to the grooves, and ball elements can be retained on an outer side surface 348c (in FIG. 12) of inner structure body 308 to displace the movable elements as inner structure 304 rotates relative to outer structure 302. This is similar to the variation illustrated for SPSM 200 in FIG. 11. Moreover, as described in variants of SPSM 200, ball elements on inner structure body 308 can be received in guide channels in outer structure body 306, allowing the ball elements to double up as bearing supports. This is similar to the variations illustrated for SPSM 200 in FIGS. 8-11. In general, SPSM 300 is deemed to have all the features of SPSM 200, and variants thereof, described with reference to FIGS. 4-11, except for the details of the energy harvesters.

Figure 14:
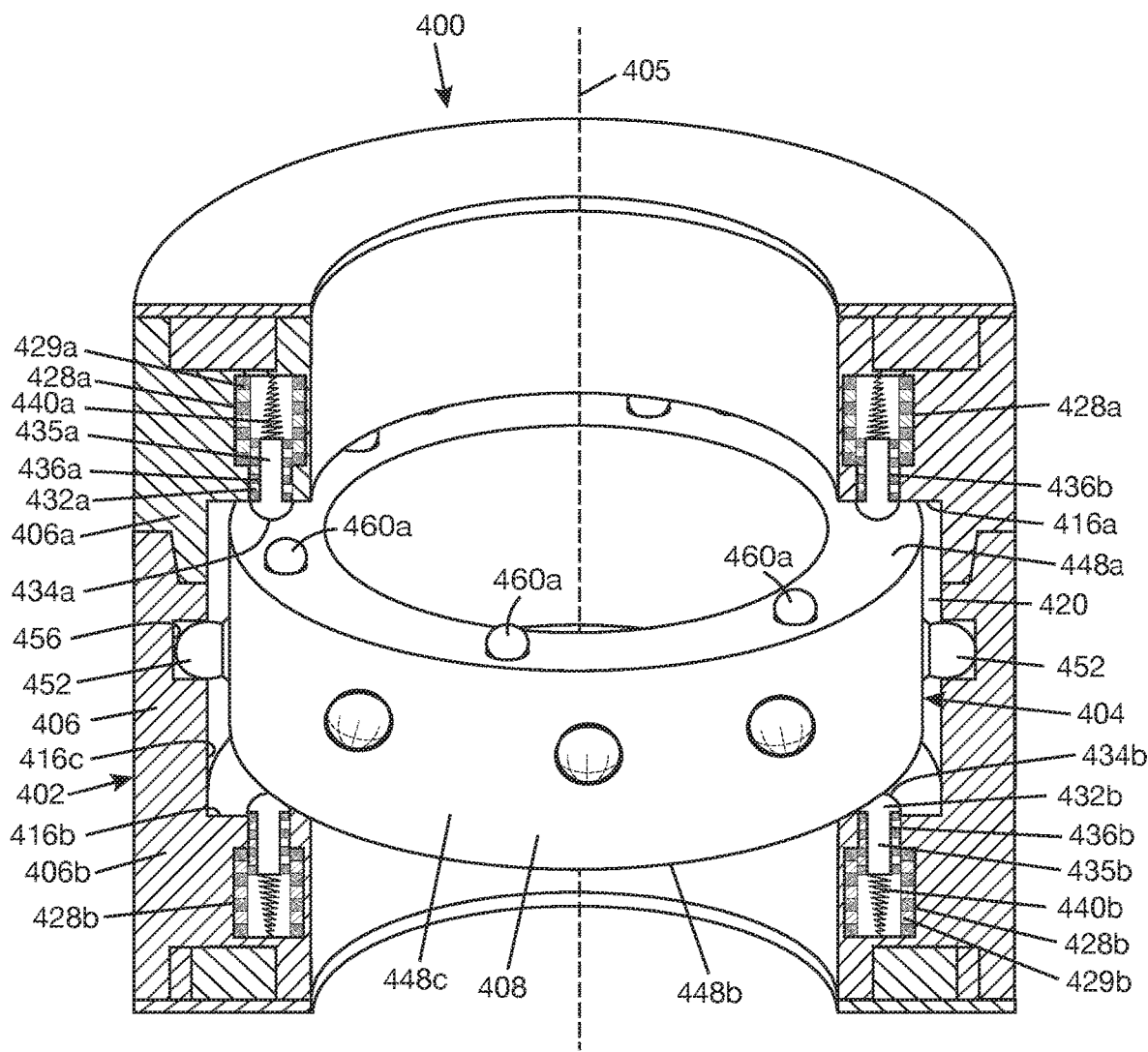
FIG. 14 is a partial cutaway view of another implementation of the SPSM of FIG. 1 with triboelectric energy harvesters.

FIG. 14 shows another exemplary SPSM 400 employing triboelectric energy harvesters to generate electricity. SPSM 400 can be used as SPSM 100 in FIGS. 1-3. SPSM 400 is similar to SPSM 200 in nearly all respects. The main difference between SPSM 400 and SPSM 200 is in the configuration of the energy harvesters. SPSM 400 includes a pipe-in-pipe structure having an outer structure 402 and an inner structure 404 that is disposed within outer structure 402. Outer structure 402 has an outer structure body 406 with a cavity 420. Inner structure 404 is disposed within cavity 420 and is rotatable relative to outer structure body 406 about a rotational axis 405. Rotational axis 405 may be an axial axis of the pipe-in-pipe structure. Inner structure 404 has an inner structure body 408. Rotation of inner structure 404 relative to outer structure 402 may be supported by bearing members 452 retained on an outer side surface 448c of inner structure body 408 and received in a mating guide channel 456 in an inner side surface 416c of outer structure body 406. Ball elements 460a are retained on an outer top surface 448a of inner structure body 408, and ball elements 460b (visible in FIGS. 15A-15C) are retained on an outer bottom surface 448b of inner structure body 408. Ball elements 460a, 460b may be arranged in circular patterns on the respective surfaces of inner structure body 408. Grooves 428a are formed in a top portion 406a of outer structure body 406 and have openings on an inner top surface 416a of outer structure body 406 that is in opposing relation to outer top surface 448a of inner structure body 408. Similarly, grooves 428b are formed in a bottom portion 406b of outer structure body 406 and have openings on an inner bottom surface 416b of outer structure body 406 that is in opposing relation to outer bottom surface 448b of inner structure body 408. Movable elements 436a, 436b are disposed in grooves 428a, 428b.

Now to the difference between SPSM 400 and SPSM 200, each movable element 436a, 436b has a stem 435a, 435b terminating in a curved contact end 434a, 434b. In one example, each curved end 434a, 434b has a convex shape, e.g., a portion of a spherical shape. Energy harvesting element (EHE) 432a is disposed on a side surface of stem 435a of movable element 436a. EHE 429a is disposed on a side wall of groove 428a that is adjacent to the side surface of stem 435a. EHEs 432a and 429a are in contact, and EHE 432a is positioned to slide along EHE 429a as movable element 436a is displaced relative to groove 428a. Similarly, EHE 432b is disposed on a side surface of stem 435b of movable element 436b. EHE 429b is disposed on a side wall of groove 428b that is adjacent to the side surface of stem 435b. EHEs 432b and 429b are in contact, and EHE 429b is positioned to slide along EHE 432b as movable element 436b is displaced relative to groove 428b. Movable elements 436a, 436b may be movably suspended in their respective grooves 428a, 428b by means of one or more springs 440a, 440b. In some cases, springs that move within movement tracks in the grooves may be used to suspend the movable elements. In addition to suspending movable elements 432a, 436b in respective grooves, springs 440a, 440b may also act to restore movable elements 436a, 436b to their respective home positions. In the home positions, contact ends 434a, 434b may extend into a gap between inner surfaces 416a, 416b of outer structure body 406 and outer surfaces 448a, 448b of inner structure body 408.

Figure 14A:
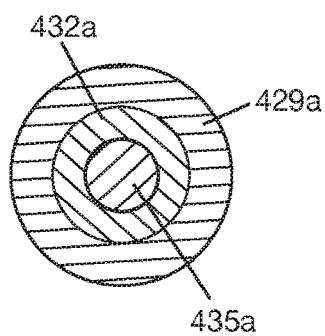
FIG. 14A is a cross-section showing a configuration of shapes of energy harvesting elements (EHEs) positioned in sliding contact between a groove and a movable element.
Figure 14B:
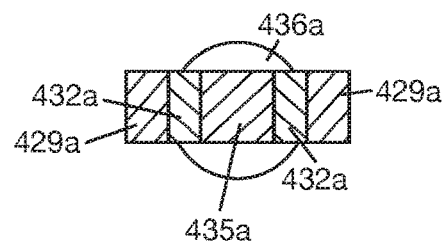
FIG. 14B is a cross-section showing a configuration of shapes of EHEs positioned in sliding contact between a groove and a movable element.

Each of EHEs 432a, 429a, 432a, 429b includes a periodic array of two different materials (different cross hatchings are used to indicate the two different materials). In one implementation, the two different materials are materials A and B with opposed electron affinities, as previously described in connection with SPSM 200. The two different materials are arranged alternately in the array. In this implementation, EHEs 432a, 429a, 432a, 429a made of periodic arrays of materials A and B provide tribo-surfaces, where each tribo-surface is formed of an alternating arrangement of material A and material B. Stems 335a, 335b and EHEs 432a, 429a, 432b, 429b may have suitable shapes to enable sliding contact between EHEs 432a, 432b on the stems and EHEs 429a, 429b on the side walls of the grooves. FIG. 14A shows an example where each of stem 435a, EHE 429a in contact with stem 435a, and EHE 429a in contact with EHE 429a has a circular cross-section. FIG. 14B shows an example where stem 435a has a square cross-section. Two EHEs 432a are disposed on opposite sides of stem 435a, and each has a rectangular cross-section. Two EHEs 429a are disposed adjacent to the two EHEs 432a. The examples shown in FIGS. 14A and 14B could be applied to stem 435b and EHEs 432b, 429b. Moreover, other shapes of stems and EHEs besides those shown in FIGS. 14A and 14B are possible.

Figure 15A:
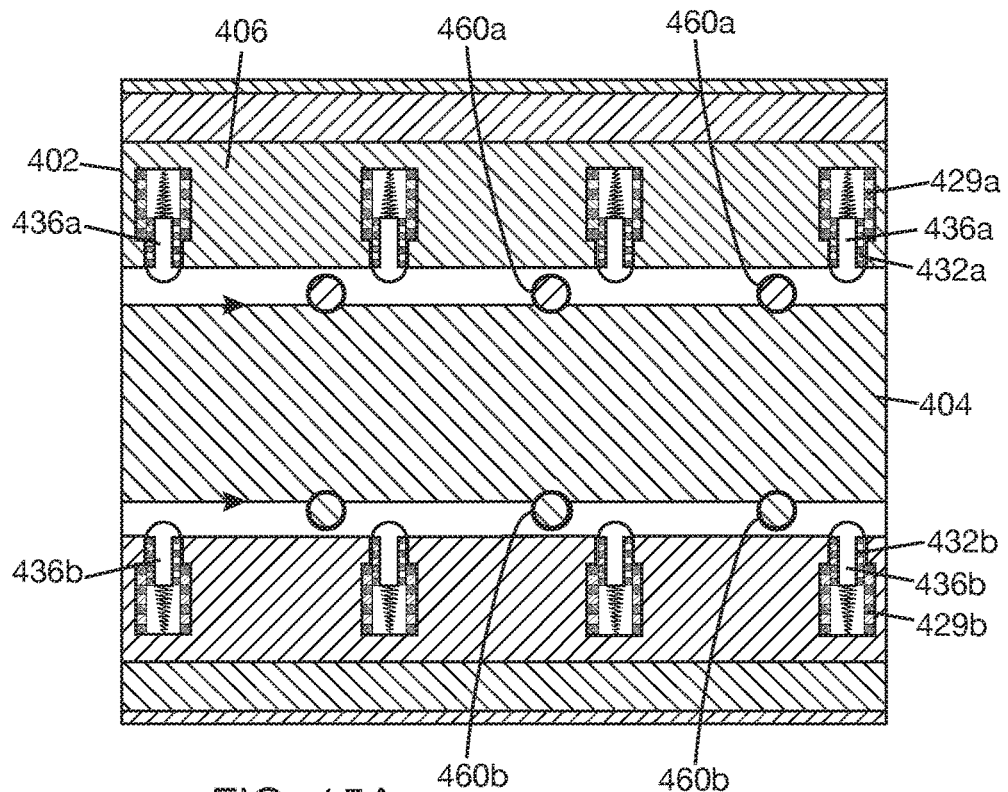
FIGS. 15A-15C show cross-sections of the SPSM of FIG. 14 at different rotational states, taken generally along a curved line similar to 10A-10A in FIG. 9, with the curved cross-section flattened out for ease of illustration.
Figure 15B:
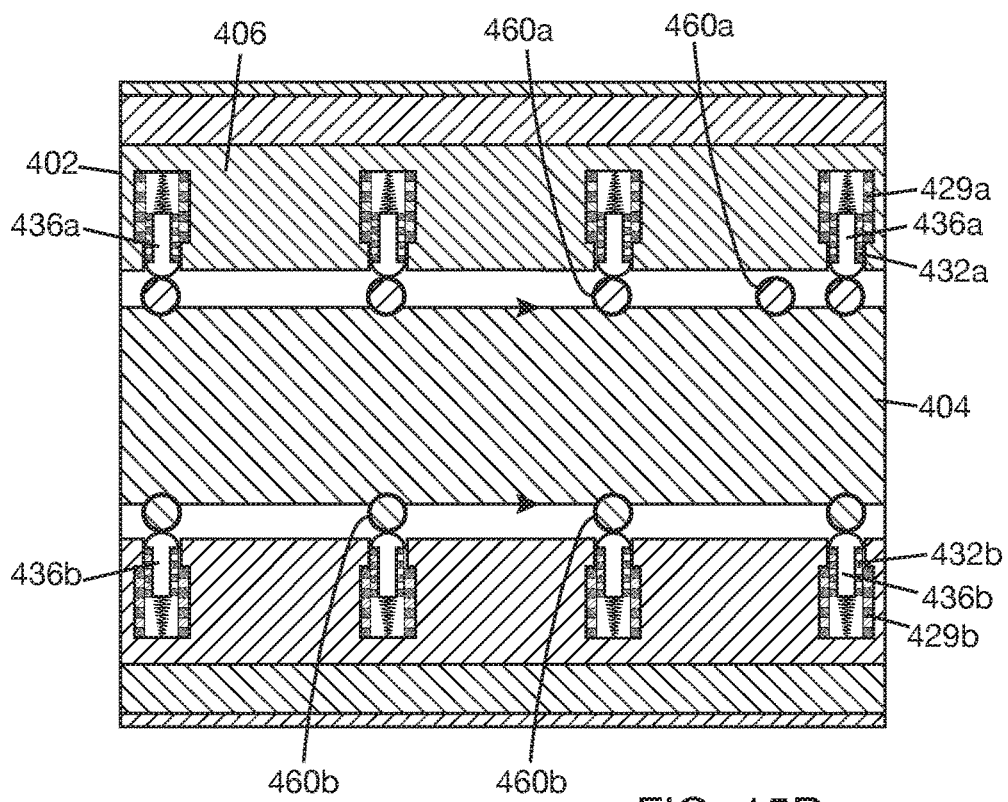
Figure 15C:
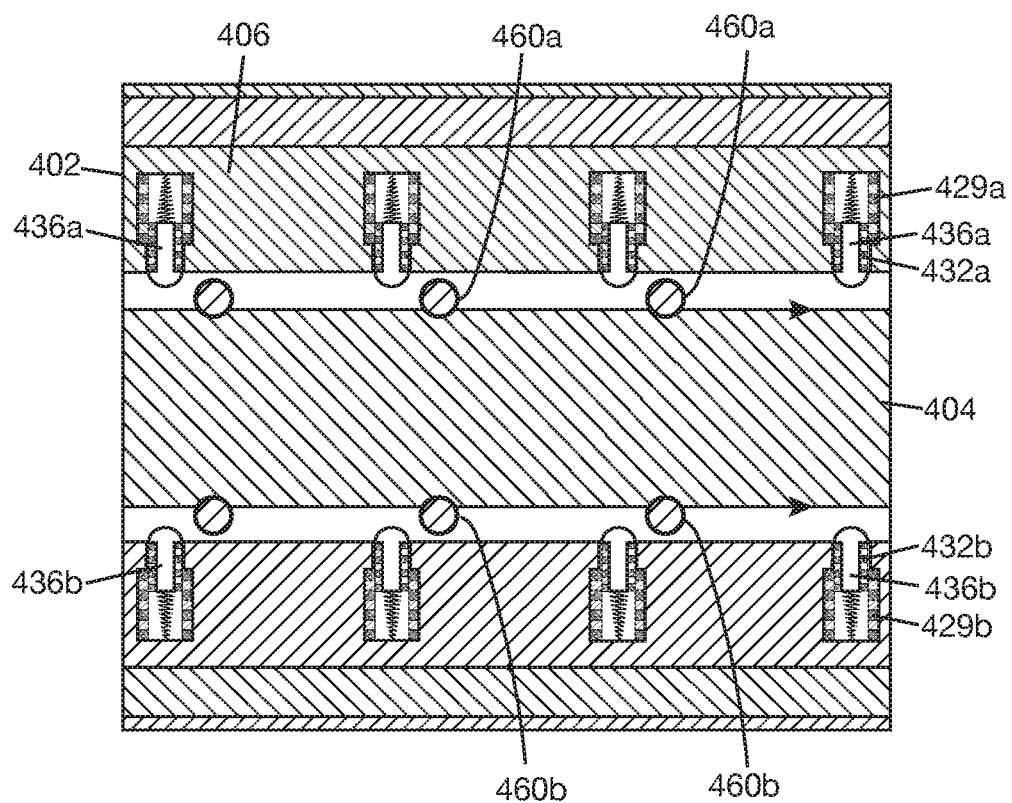

As inner structure 404 rotates relative to outer structure 402, ball elements 460a, 460b will contact movable elements 436a, 436b and then separate from movable elements 436a, 436b. When ball elements 460a, 460b contact movable elements 436a, 436b, movable elements 436a, 436b are propelled towards end walls of grooves 428a, 428b, resulting in sliding of EHEs 432a, 432b along EHEs 429a, 429b. When ball elements 460a, 460b separate from movable elements 436a, 436b, movable elements 436a, 436b will return to their home positions. FIG. 15A shows a state where ball elements 460a, 460b are approaching movable elements 436a, 436b. FIG. 15B shows a state where ball elements 460a, 460b are in contact with movable elements 436a, 436b. Movable elements 436a, 436b have been displaced inwardly of their respective grooves 428a, 428b compared to the state shown in FIG. 15A. FIG. 15C shows a state where ball elements 460a, 460b have separated again from movable elements 436a, 436b and movable elements 436a, 436b are again at their home positions. As EHE 432a slides relative to EHE 429a, a layer of material A in EHE 432a will make sliding contact with a layer of material B in EHE 432a, and a layer of material B in EHE 432a will make sliding contact with a layer of material A in EHE 429a. Similarly, as EHE 432b slides relative to EHE 429b, material A in EHE 432b will make sliding contact with material B in EHE 432b, and a material B in EHE 432b will make sliding contact with a material A in EHE 429b. These sliding contacts between materials of opposite electron affinities result in electrical charges by the triboelectric effect. The electrical charges can be used to power sensors and other electronics in the SPSM.

To maximize generation of electricity, grooves with openings on an inner surface 416c (in FIG. 14) of outer structure body 406 can be formed, movable elements can be disposed in the grooves, EHEs made of periodic arrays of materials A and B and arranged in sliding contact can be positioned in the grooves, and ball elements can be positioned on a side surface 448c (in FIG. 14) of inner structure body 208 to displace the movable elements and produce relative sliding between the periodic arrays as the inner structure 404 rotates relative to the outer structure 402. This is similar to the variation illustrated for SPSM 200 in FIG. 11. Moreover, as described in variants of SPSM 200, ball elements on inner structure body 408 can be received in guide channels in outer structure body 406, allowing the ball elements to double up as bearing supports. This is similar to the variations illustrated for SPSM 200 in FIGS. 8-11. In general, SPSM 400 is deemed to have all the features of SPSM 200, and variants thereof, described with reference to FIGS. 4-11, except for the details of the energy harvesters.

Figure 16:
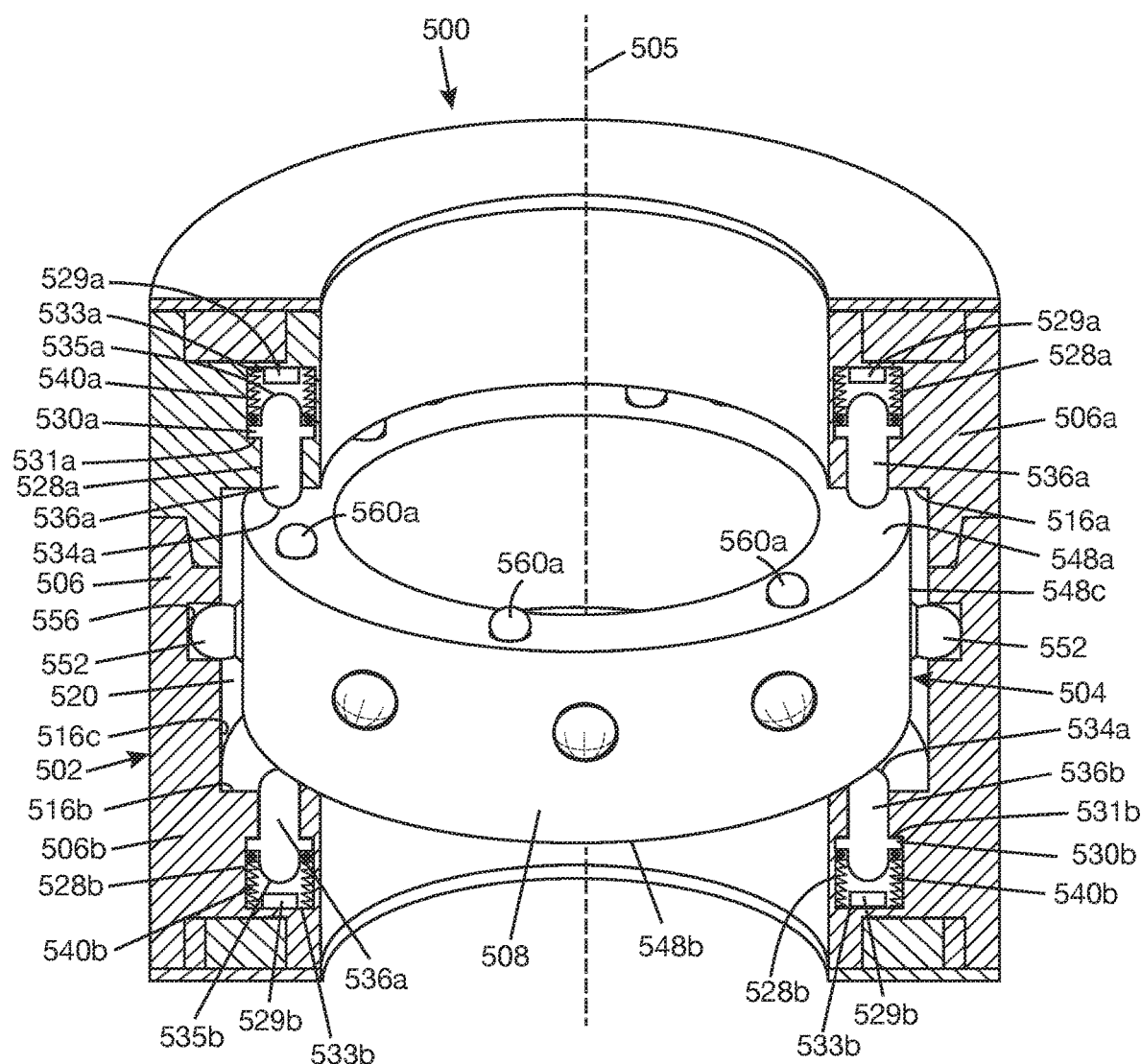
FIG. 16 is a partial cutaway view of another implementation of the SPSM of FIG. 1 with piezoelectric energy harvesters.

FIG. 16 shows another exemplary SPSM 500 employing piezoelectric energy harvesters to generate electricity. SPSM 500 can be used as SPSM 100 in FIGS. 1-3. SPSM 500 is identical to SPSM 200 in nearly all respects. The main difference between SPSM 500 and SPSM 200 is in the configuration of the energy harvesters. SPSM 500 includes a pipe-in-pipe structure having an outer structure 502 and an inner structure 504 disposed within outer structure 502. Outer structure 502 has an outer structure body 506 with a cavity 520. Inner structure 504 is disposed within cavity 520 and is rotatable relative to outer structure body 506 about a rotational axis 505. Rotational axis 505 may be an axial axis of the pipe-in-pipe structure. Inner structure 504 has an inner structure body 508. Rotation of inner structure 504 relative to outer structure 502 may be supported by bearing members 552 retained on an outer side surface 548c of inner structure body 508 and received in a mating guide channel 556 in an inner side surface 516c of outer structure body 506. Ball elements 560a are retained on an outer top surface 548a of inner structure body 508, and ball elements 560b (visible in FIGS. 17A-17C) are retained on an outer bottom surface 548b of inner structure body 508. Ball elements 560a, 560b may be arranged in circular patterns on the respective surfaces of inner structure body 508. Grooves 528a are formed in a top portion 506a of outer structure body 506 and have openings on an inner surface 516a of outer structure body 506 that is in opposing relation to outer top surface 548a of inner structure body 508. Similarly, grooves 528b are formed in a bottom portion 506b of outer structure body 506 and have openings on an inner bottom surface 516b of outer structure body 506 that is in opposing relation to outer bottom surface 548b of inner structure body 508. Movable elements 536a, 538b are disposed in grooves 528a, 526b.

Now to the difference between SPSM 500 and SPSM 200, each movable element 536a has an inner contact surface 535a and an outer contact surface 534a. Contact surfaces 535a, 534a are convex surfaces, such as portions of a spherical surface. Inner contact surface 535a is in opposing relation to an end wall 533a of the respective groove 528a. Similarly, each movable element 536b has an inner contact surface 535b and an outer contact surface 535b. Contact surfaces 535b, 534b are convex surfaces, such as portions of a spherical surface. Inner contact surface 535b is in opposing relation to an end wall 533b of the respective groove 528b. An energy harvesting element (EHE) 529a is disposed on end wall 533a of groove 528a. A EHE 529b is disposed on end wall 533b of groove 528a. EHEs 529a, 529b are films or sheets of a piezoelectric material (each EHE may have a single layer or multiple layers of piezoelectric material). Examples of piezoelectric materials include, but are not limited to, quartz, lanthanum gallium silicate (langasite), lithium niobate, titanium oxide, and lead zirconate titanate (PZT). Movable elements 536a, 536b may be retained in the respective grooves 528a, 528b by springs 540a, 540b. In one example, springs 540a, 540a may be guided along movement tracks in the respective grooves. In another example, which is illustrated, grooves 528a, 528b may have shoulders (or seats) 531a, 531b, and movable elements 536a, 536b may have flanges that abut shoulders (or seats) 530a, 530b when movable elements 536a, 536b are in the home position (i.e., in a position when movable elements 536a, 536b are not in contact with ball elements 560a, 560b). Springs 540a, 540b may be attached between end walls 533a, 533b of grooves 528a, 528b and flanges of movable elements 536a, 536b.

Figure 17A:
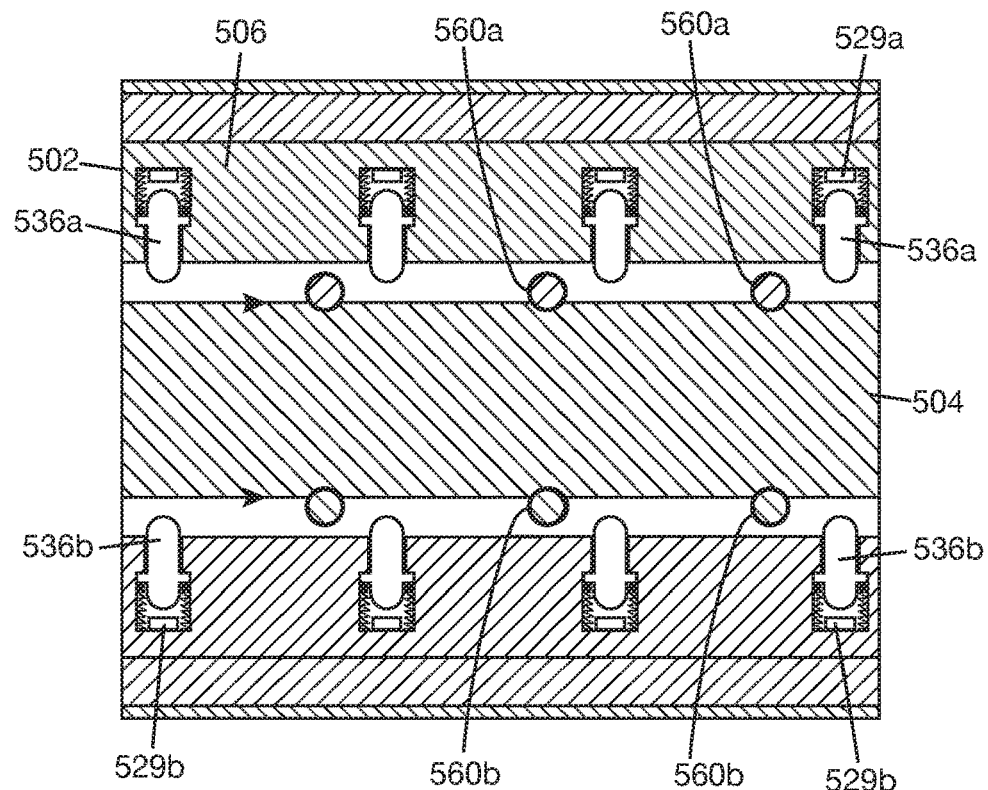
FIGS. 17A-17C show cross-sections of the SPSM of FIG. 16 at different rotational states, taken generally along a curved line similar to 10A-10A in FIG. 9, with the curved cross-section flattened out for ease of illustration.
Figure 17B:
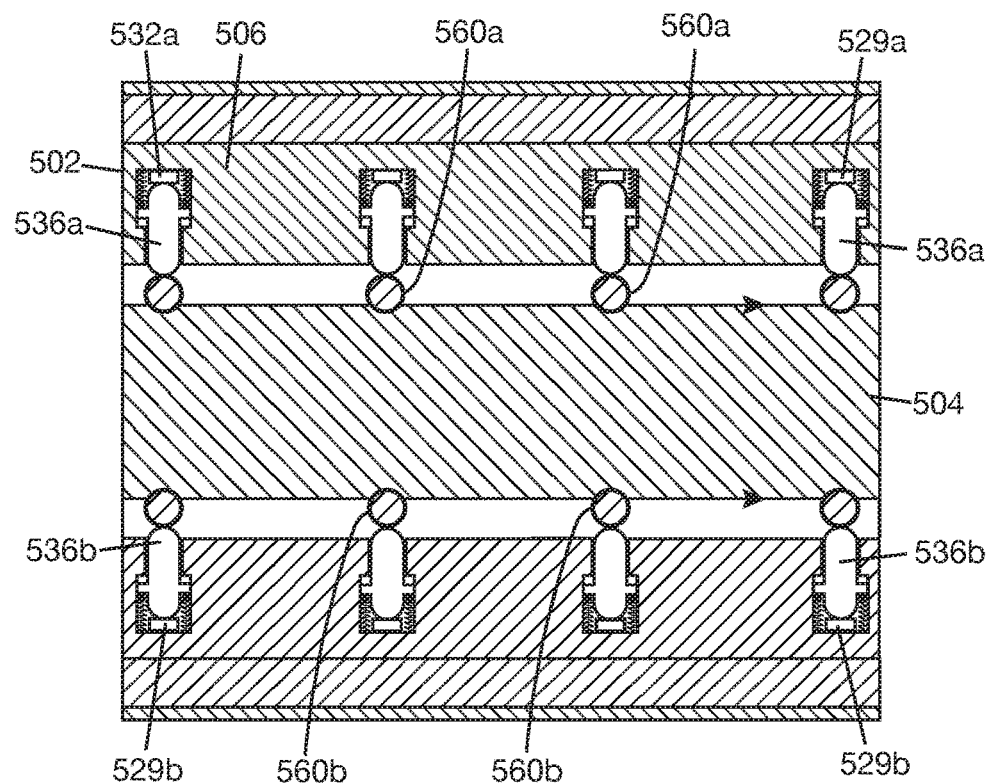
Figure 17C:
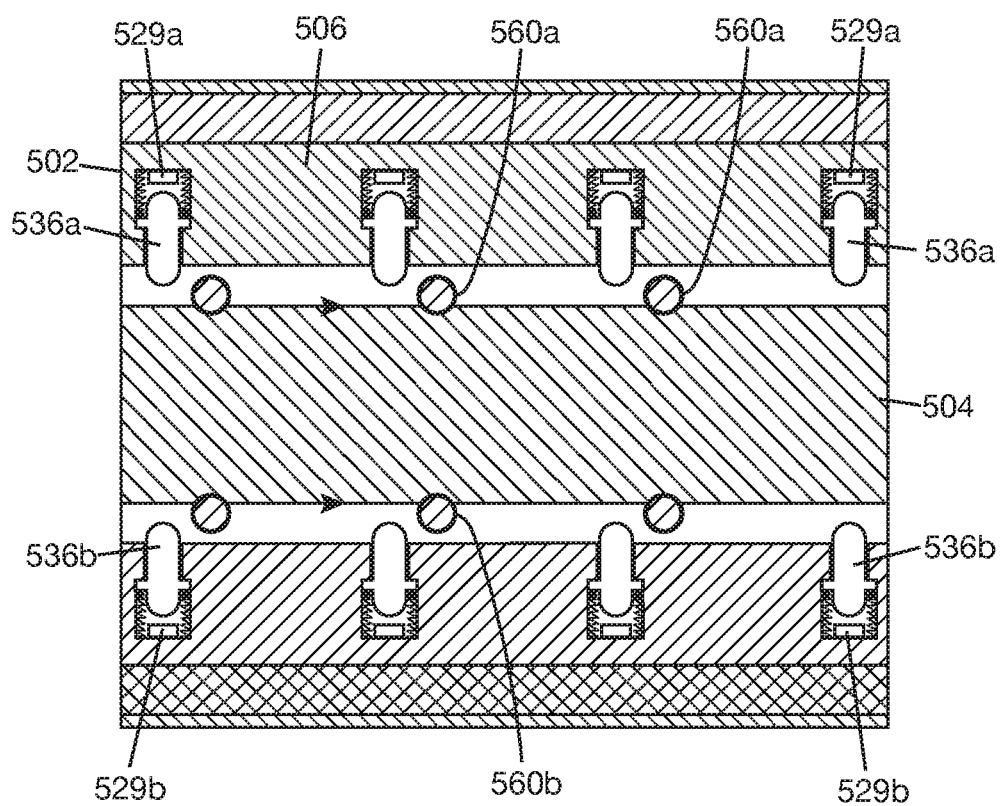

In the home position of movable elements 536a, 536b, inner contact surfaces 535a, 535b are separated from respective EHEs 529a, 529b by gaps. Movable elements 536a, 536b can travel through these gaps to contact EHEs 529a, 529b. As inner structure 504 rotates relative to outer structure 502, ball elements 560a, 560b will contact movable elements 536a, 536b and then separate from movable elements 536a, 536b. When ball elements 560a, 560b contact movable elements 536a, 536b, movable elements 536a, 536b are propelled towards end walls 533a, 533b of the respective grooves 528a, 528b, resulting in contact between inner contact surfaces 535a, 535b and respective EHEs 529a, 529b. When ball elements 560a, 560b separate from movable elements 536a, 536b again, movable elements 536a, 536b will return to their home positions. FIG. 17A shows a state where ball elements 560a, 560b are approaching movable elements 536a, 536b. FIG. 17B shows a state where ball elements 560a, 560b are in contact with movable elements 536a, 536b. Movable elements 560a, 560b have been displaced inwardly of their respective grooves 528a, 528b compared to the state shown in FIG. 17A. FIG. 17C shows a state where ball elements 560a, 560b have separated again from movable elements 536a, 536b, and movable elements 536a, 536b are again at their home positions. Compression of EHEs 529a, 529b during contact with movable elements 536a, 536b will induce mechanical stresses in EHEs 529a, 529b, which would result in electrical charges inside EHEs 529a, 529b. The electrical charges accumulated in EHEs 529a, 529b can be used to power sensors and other electronics inside the SPSM.

To maximize generation of electricity, grooves with openings on an inner side surface 516c (in FIG. 16) of outer structure body 506 can be formed, movable elements can be disposed in the grooves, EHEs with piezoelectric material can be disposed on end walls of the grooves to be compressed in response to displacement of the movable elements, and ball elements can be retained on an outer side surface 548c (in FIG. 16) of inner structure body 508 to displace the movable elements as inner structure 504 rotates relative to outer structure 502. This is similar to the variation illustrated for SPSM 200 in FIG. 11. Moreover, as described in variants of SPSM 200, ball elements on inner structure body 508 can be received in guide channels in outer structure body 506, allowing the ball elements to double up as bearing supports. This is similar to the variations illustrated for SPSM 200 in FIGS. 8-11. In general, SPSM 500 is deemed to have all the features of SPSM 200, and variants thereof, described with reference to FIGS. 4-11, except for the details of the energy harvesters.

A SPSM employing magnetostrictive energy harvesters can be constructed based on SPSM 500 and by replacing the piezoelectric material of EHEs 329a, 329b with magnetostrictive material. Examples of magnetostrictive materials include, but are not limited to, Terfenol-D (an alloy of Terbium, Dysprosium, and Iron), Galfenol (an alloy of iron and gallium), and Metglas (metallic glass alloy). The mechanical stress applied to the magnetostrictive EHEs due to the contact of the ball elements 560a, 560b with movable elements 536a, 536b will result in a change in magnetic field of the magnetostrictive EHE. This induced magnetic field can be converted into a voltage by a planar pick-up coil or a solenoid placed in the vicinity of the magnetostrictive EHE.

Figure 18:
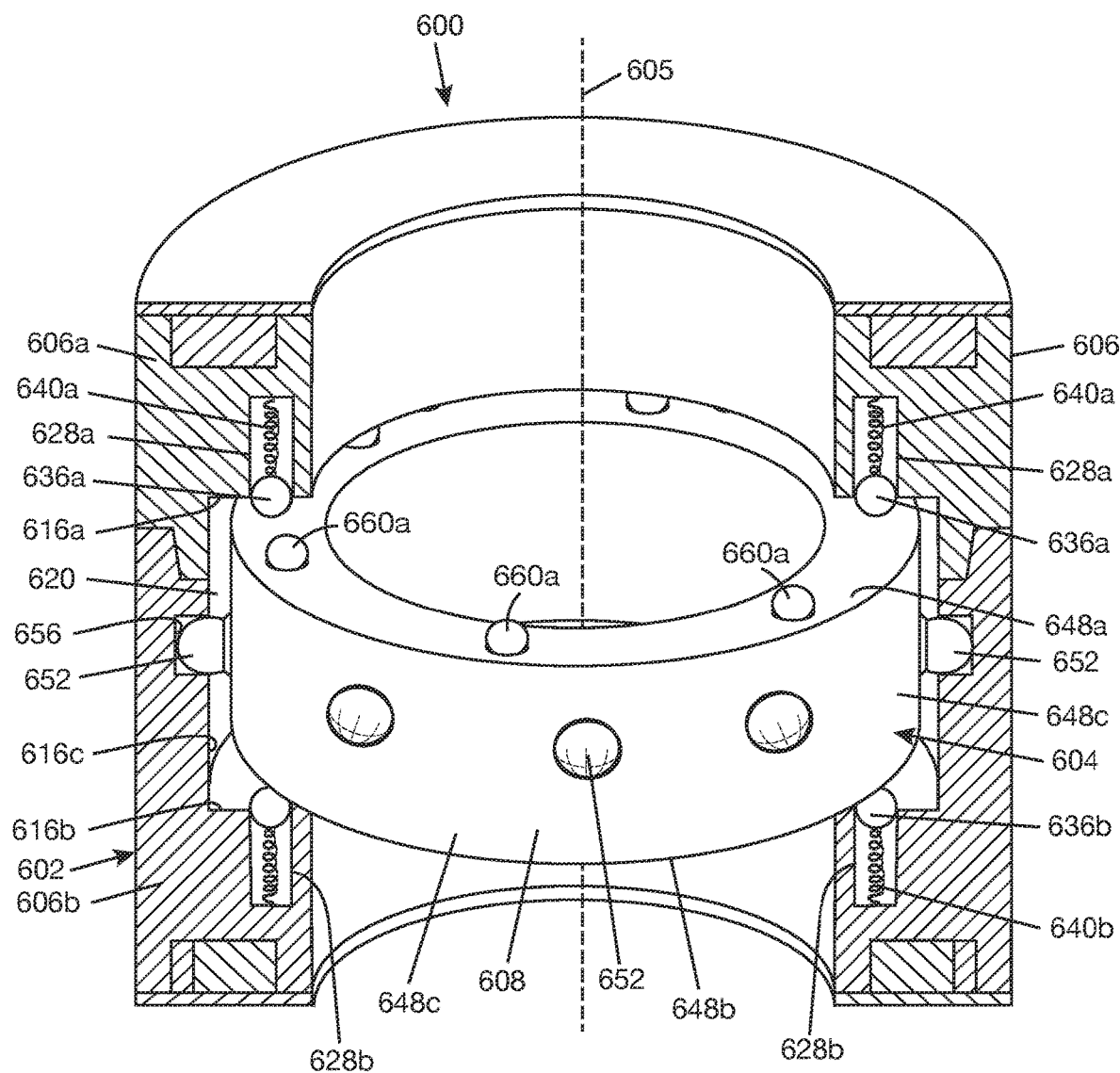
FIG. 18 is a partial cutaway view of another implementation of the SPSM of FIG. 1 with piezoelectric energy harvesters.

FIG. 18 shows another exemplary SPSM 600 employing piezoelectric energy harvesters to generate electricity. SPSM 600 can be used as SPSM 100 in FIGS. 1-3. SPSM 600 is identical to SPSM 200 in nearly all respects. The main difference between SPSM 600 and SPSM 200 is in the configuration of the energy harvesters. SPSM 600 includes a pipe-in-pipe structure having an outer structure 602 and an inner structure 604 disposed within outer structure 602. Outer structure 602 has an outer structure body 606 with a cavity 620. Inner structure 604 is disposed within cavity 620 and is rotatable relative to outer structure body 606 about a rotational axis 605. Rotational axis 605 may be an axial axis of the pipe-in-pipe structure. Inner structure 604 has an inner structure body 608. Rotation of inner structure 604 relative to outer structure 602 may be supported by bearing members 652 retained on an outer side surface 648c of inner structure body 608 and received in a mating guide channel 656 in an inner side surface 616c of outer structure body 606. Ball elements 660a are retained on an outer top surface 648a of inner structure body 608, and ball elements 660b are retained on an outer bottom surface 648b of inner structure body 608. Ball elements 660a, 660b may be arranged in circular patterns on their respective surfaces of inner structure body 608. Grooves 628a are formed in a top portion 606a of outer structure body 606 and have openings on an inner top surface 616a of outer structure body 606 that is in opposing relation to outer top surface 648a of inner structure body 608. Similarly, grooves 628b are formed in a bottom portion 606b of outer structure body 606 and have openings on an inner bottom surface 616b of outer structure body 606 that is in opposing relation to outer bottom surface 648b of inner structure body 608. Movable elements 636a, 636b are disposed in grooves 628a, 626b. In one example, movable elements 636a, 636b have spherical shapes. In general, movable elements 636a, 636b may have shapes to provide convex contact surfaces, which are the surfaces with which movable elements 636a, 636b will interact with ball elements 660a, 660b.

Figure 19A:
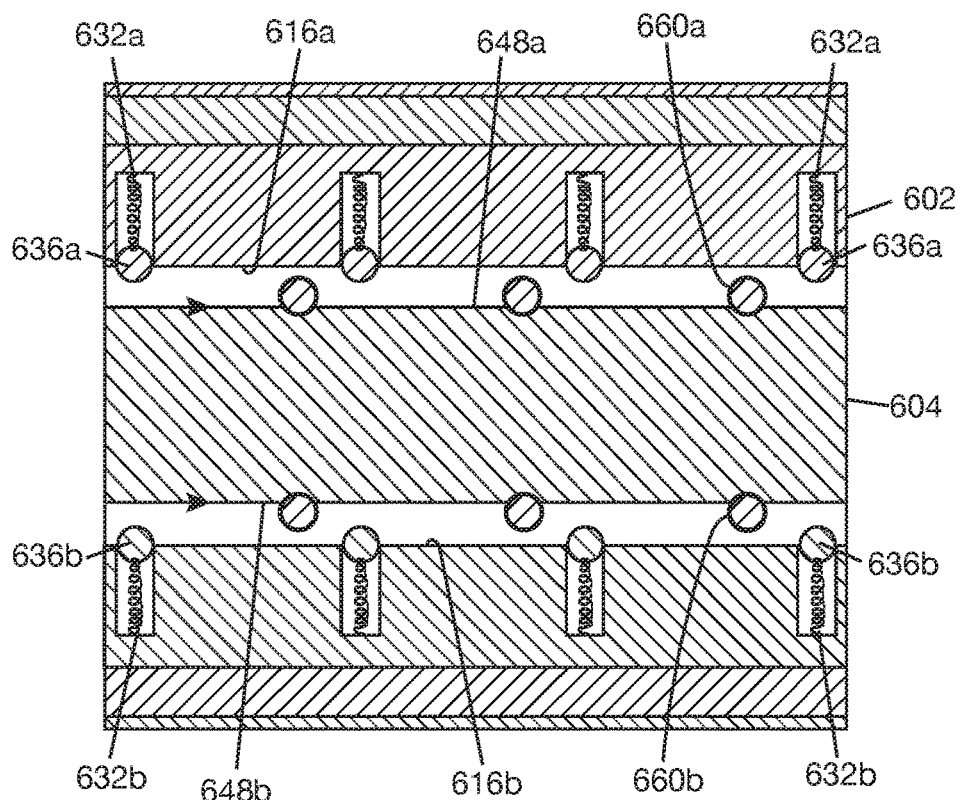
FIGS. 19A-19C show cross-sections of the SPSM of FIG. 18 at different rotational states, taken generally along a curved line similar to 10A-10A in FIG. 9, with the curved cross-section flattened out for ease of illustration.
Figure 19B:
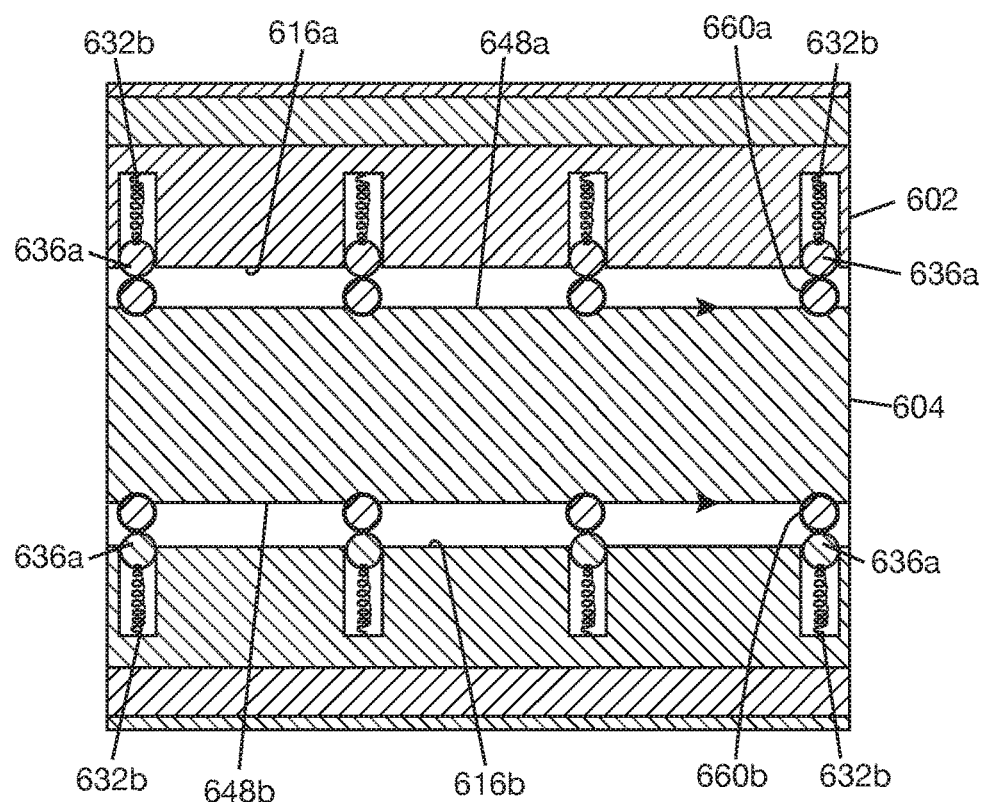
Figure 19C:
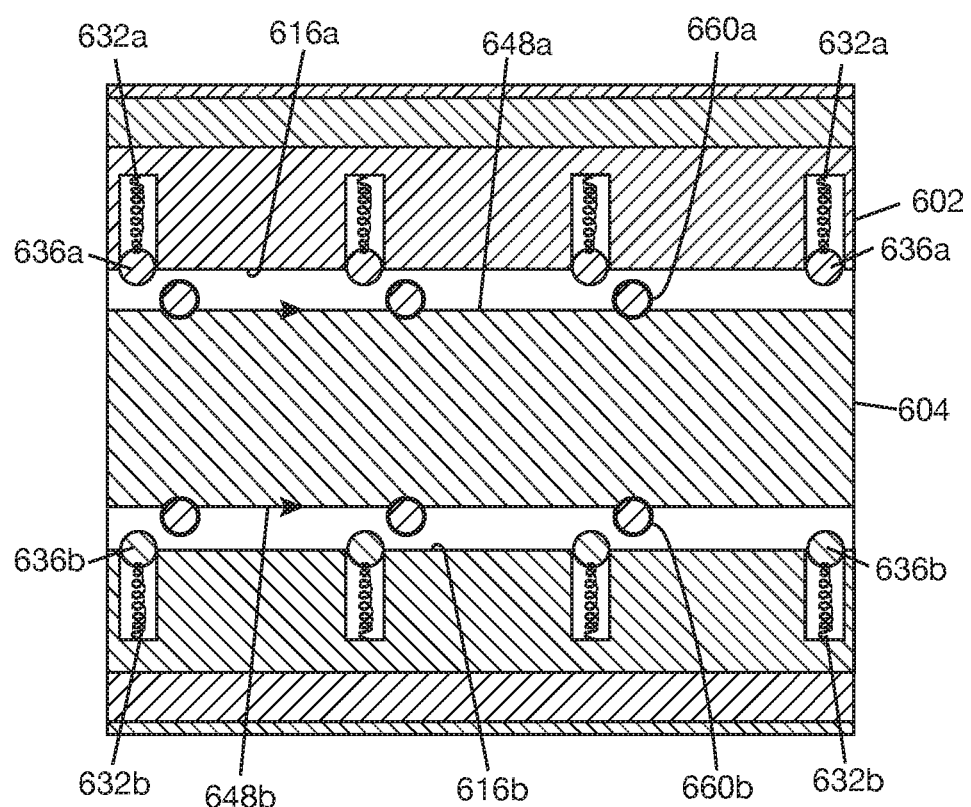

Now to the difference between SPSM 600 and SPSM 200, energy harvesting elements (EHE) 632a, 632b are disposed within grooves 628a, 628b. EHEs are ribbon structures. EHEs 632a, 632b may be attached between end walls of grooves 628a, 628b and movable elements 636a, 636b and can be flexed and compressed by displacement of movable elements 636a, 636b relative to grooves 628a, 628b. EHEs 632a, 632b include nanoribbons, i.e., nanosized strips of material. In a particular example, EHEs 632a, 632b include piezoelectric nanoribbons. In one example, the piezoelectric ribbons may be ceramic nanoribbons such as those made from lead zirconate titanate (or PZT). The piezoelectric ribbons may be encased in or printed on a flexible material, such as a flexible elastomer. Movable elements 636a are movably supported within grooves 628a, e.g., by piezoelectric EHEs 632a, with the convex contact surfaces of movable elements 636a exposed to the gap between inner top surface 616a of outer structure body 206 and outer top surface 648a of inner surface body 208. Similarly, movable elements 626b are movably supported within grooves 628b, e.g., by piezoelectric EHEs 632b, with the convex contact surfaces of movable elements 626b exposed to the gap between inner bottom surface 616b of outer structure body 206 and outer bottom surface 648b of inner structure body 608. As inner structure 604 rotates relative to outer structure 602, ball elements 606a cycle through contacting movable elements 626a and separating from movable elements 626a. Also, ball elements 606b cycle through contacting movable elements 626b and separating from movable elements 626b. FIG. 19A shows a state where ball elements 606a, 606b are approaching movable elements 636a, 636b. FIG. 19B shows a state where ball elements 606a, 606b are in contact with movable elements 636a, 636b. Movable elements 606a, 606b have been displaced inwardly of their respective grooves 628a, 628b compared to the state shown in FIG. 19A. FIG. 19C shows a state where ball elements 606a, 606b have separated again from movable elements 636a, 636b, and movable elements have returned to their home positions. The movement of movable elements 606a, 606b relative to grooves 628a, 628b as a result of contact and separation of ball elements 606a, 606b with movable elements 606a, 606b results in mechanical stresses in piezoelectric EHEs 632a, 632b, which results in generation of electric charges within piezoelectric EHEs 632a, 632b. These electric charges can be used to power sensors and other electronics in the SPSM.

To maximize generation of electricity, grooves with openings on an inner side surface 616c (in FIG. 18) of outer structure body 606 can be formed, movable elements can be disposed in the grooves, ribbon structured EHEs with piezoelectric material can be arranged in the grooves to be flexed in response to displacement of the movable elements, and ball elements can be retained on an outer side surface 648c (in FIG. 18) of inner structure body 608 to displace the movable elements as inner structure 604 rotates relative to outer structure 602. This is similar to the variation illustrated for SPSM 200 in FIG. 11. Moreover, as described in variants of SPSM 200, ball elements on inner structure body 608 can be received in guide channels in outer structure body 606, allowing the ball elements to double up as bearing supports. This is similar to the variations illustrated for SPSM 200 in FIGS. 8-11. In general, SPSM 600 is deemed to have all the features of SPSM 200, and variants thereof, described with reference to FIGS. 4-11, except for the details of the energy harvesters.

Figure 20:
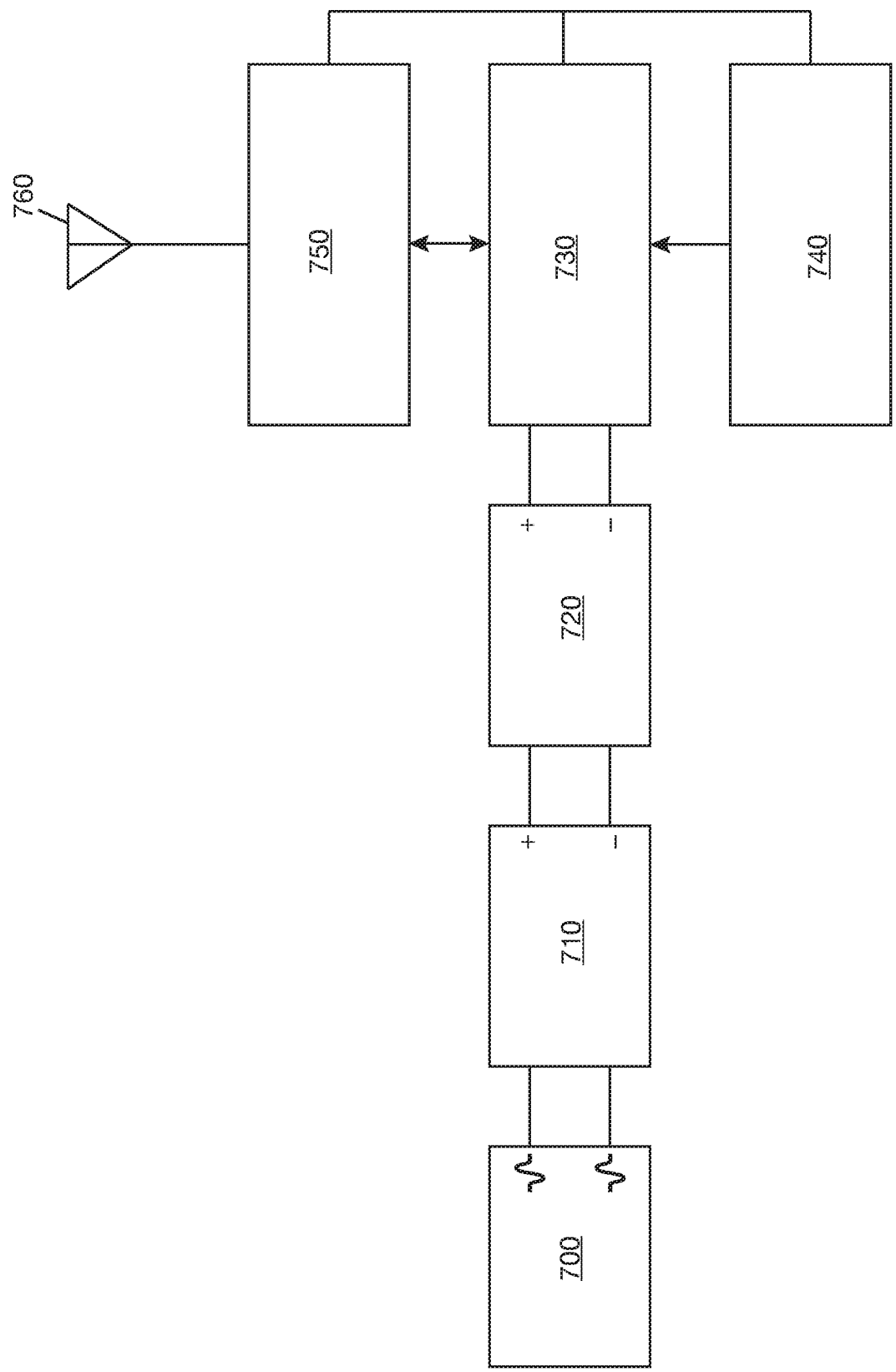
FIG. 20 is a block diagram of a SPSM system.

FIG. 20 is a block diagram of a SPSM at a system level according to one illustrative implementation. Energy harvesters 700, which may be any of the triboelectric, piezoelectric, and magnetostrictive harvesters of any of SPSMs 200, 300, 400, 500, and 600, produce electricity, typically in the form of alternating current (AC). An AC/DC converter 710 converts the AC output to direct current (DC). AC/DC converter 710 may be, for example, a bridge rectifier circuit employing diodes. The DC output of AC/DC converter 710 is stored in an energy storage 720. Energy storage 720 may be, for example, a regular capacitor de-rated for use at high temperatures, a ceramic capacitor, an electrolytic capacitor, or a supercapacitor. Energy storage 720 provides power to a low power signal processing circuitry 730. For example, signal processing circuitry 730 may be CMOS-based, microcontroller based, digital signal processor, DSP-based, field programmable gate array (FGPA)-based, application-specific integrated circuit (ASIC)-based, complex programmable logic device (CPLD), or a system-on-chip (SoC).

Signal processing circuitry 730 is in communication with a sensor module 740 and a communications module including a transceiver 750 and an antenna 760. Sensor module 740 includes one or more sensors or measuring instruments for measuring downhole drilling parameters. Sensor module 740 may include a variety of sensors, such as one or more of low power temperature, pressure, vibration, strain, magnetic field, electric field, magnetic, optical, acoustic, accelerometer, and gyroscope sensors. Signal processing circuitry 730 performs low power signal processing, conditions measurement data from sensor module 740, and stores the data in a local memory. Local memory may be volatile memory or non-volatile memory. Non-volatile memory may be preferred to prevent the need to constantly provide power to the memory in order to retain data. The signal processing circuitry 730 also performs power management by interfacing with energy storage 720 to deliver the appropriate system voltages and load currents to the circuit blocks in an efficient matter. Signal processing circuitry 730 may transmit data to the surface or to another SPSM through transceiver 750, which uses antenna 760. Transceiver 750 uses lower power wireless technologies, such as low-power Wi-Fi, Bluetooth, Bluetooth Low Energy, ZigBee, or LoRaWan. Antenna 760 could be polymer-based, paper-based, PET-based, textile-based, carbon nanotube (CNT)-based, artificial magnetic conductor-based, Kapton-based, or nickel-based metamaterial. Antenna 760 may be directional, omnidirectional, or point-to-point. Antenna 760 may also be a planar antenna, such as monopole, dipole, inverted, ring, spiral, meander, or patch antenna.

The system is designed to have low power consumption by choosing lower power technologies when possible and by minimizing power usage. Signal processing circuitry 730 interprets and processes information stored in a local memory and analyzes the measurement data obtained from sensor module 740. Each of sensor module 740, transceiver 750, antenna 760, and memory associated with signal processing circuitry 730 has its own level of power usage. Sensors in sensor module 740 typically only require power when obtaining data from the environment and storing the data in memory. Once sensors have obtained data, sensors have low to no power consumption and can go to "sleep" until it is time to obtain data again. If a sensor is required to continuously obtain data, it has to be "active" continuously, and signal processing circuitry 730 will be required to obtain data at a high sample rate. Since this will rapidly drain power from energy storage 720, the sensors in sensor module 740 are designed to be active at certain periods of non-overlapping times. For example, sensors can be designed to be active at certain depths, where depth can be measured by an accelerometer, magnetometer, or a gyroscope. Transceiver 750 is designed to transmit and receive data at predetermined times or when triggered by an external signal. Moreover, since transceiver 750 requires more energy than sensors and signal processing circuitry to transmit/receive data, only a sample of the data after analysis by the signal processing circuitry 730, rather than all of the sensed data, may be transmitted/received to save power downhole. For example, all the components in the module of transceiver 750 do not have to be active continuously, nor do they have to operate simultaneously. Each component can have an active mode, a standby mode, and a sleep mode. The active mode is short since each component generally only has one short task in the whole system, followed by a relatively longer standby time and a longer sleep time. The energy saved in the standby and sleep times can be used to drive a component in the active mode.

The sensors and electronics of the SPSM can be manufactured on flexible substrates or as flexible electronics circuits. The flexible circuits can be made of metal-polymer conductors, organic polymers, printable polymers, metal foils, transparent thin film materials, glass, 2D materials such as graphene and MXene, silicon, or fractal metal dendrites. FIG. 4 shows that these flexible electronics can be disposed in compartments 272a, 272b in outer structure body 206 (similar compartments can be found in variations of SPSM 200 and other SPSM implementations). As an example, a flexible substrate 274 carrying an antenna may be disposed in upper compartment 272a. A flexible substrate 275 carrying a transceiver may be disposed in lower compartment 272b and folded to form a ring shape. A flexible substrate 276 carrying a sensor module, signal processing circuitry, AC/DC converter, an energy storage, and other electronics may be located in lower compartment 272b. Appropriate connection can be made between the antenna and transceiver in the separate compartments 272a, 272b. Appropriate communication paths can be formed between the energy harvesters in the SPSM and the electronics carried in compartments 272a, 272b. Similar compartments and flexible substrates carrying electronics can be found in variations of SPSM 200 and the other SPSM implementations 200, 300, 400, 500, 600.

Returning to FIG. 3, multiple SPSMs 100, which may be any of the SPSM implementations 200, 300, 400, 500, 600, can be placed all along drill string 120 at chosen intervals to obtain real-time distributed data. FIG. 3 shows SPSMs 100 on the outside of drill string 120. However, there is the possibility of arranging one or more of SPSMs 100 inside drill string 120. When a SPSM is arranged inside drill string 120, the outer structure of the SPSM will rotate with the drill string and around the inner structure of the SPSM. SPSMs inside the drill string can allow data collection inside the drill string, while SPSMs outside the drill string can allow data collection outside the drill string. In some cases, the data collected from inside the drill string may be used as reference data.

Using data communication modules in the SPSMs, data can be transmitted along drill string 120 wirelessly with data units moved along as in a relay from the bottom of wellbore 122 to the surface. SPSMs 100 can be placed at a chosen distance along drill string 120 based on the maximum distance that data can be electromagnetically transmitted from one SPSM to another. This method of transmitting data along the drill string using SPSM is totally independent of drilling fluid flow, is faster than mud pulse telemetry, and can be very useful in situations such as lost circulation. In the case of lost circulation, for example, the bottomhole temperature is required for designing thermosetting lost circulation material (LCM), such as resin material, to cure the losses. The success of a thermosetting LCM resin depends on how accurately the hardening temperature of the viscous LCM is matched to the bottomhole temperature. Inaccurate bottomhole temperatures can result in the resin LCM setting inside the drill string or not setting at all and ending up in a gel-like state in the lost circulation zone, which would mean that the fractured formation cannot be plugged. By obtaining real time bottom temperature via SPSMs, the correct bottomhole temperature can be determined and used to design an effective LCM.

Another important use of SPSMs 100 is in providing real time well data that can be used to evaluate kicks in fracture zones. Drilling in deep reservoirs with partial or severe loss circulation is tremendously expensive since the driller is drilling "blind" as there is no real-time data on where the mud (drilling fluid) is being lost to the formation. Without real-time data, it is impossible to know the amount and the density of mud that needs to be added into the drill string and the well annulus to control the well, keep drilling, and ensure that kicks do not travel to the surface. SPSMs 100 placed all along a drill string gives real-time distributed sensing data, which can be used to effectively monitor the well and respond immediately if there is a problem.

SPSMs 100 can be used as data storage units along a drill string, collecting data from the environment of the drill string and storing the data locally. In one implementation, memory capsules may be injected into the well from the surface to gather data from the SPSMs on the drill string. The memory capsules wirelessly interface with the SPSMs on the drill string and lay the platform for downhole internet-of-Things (IoT), opening up a variety of new ways to map and visualize the downhole environment.

Figure 21:
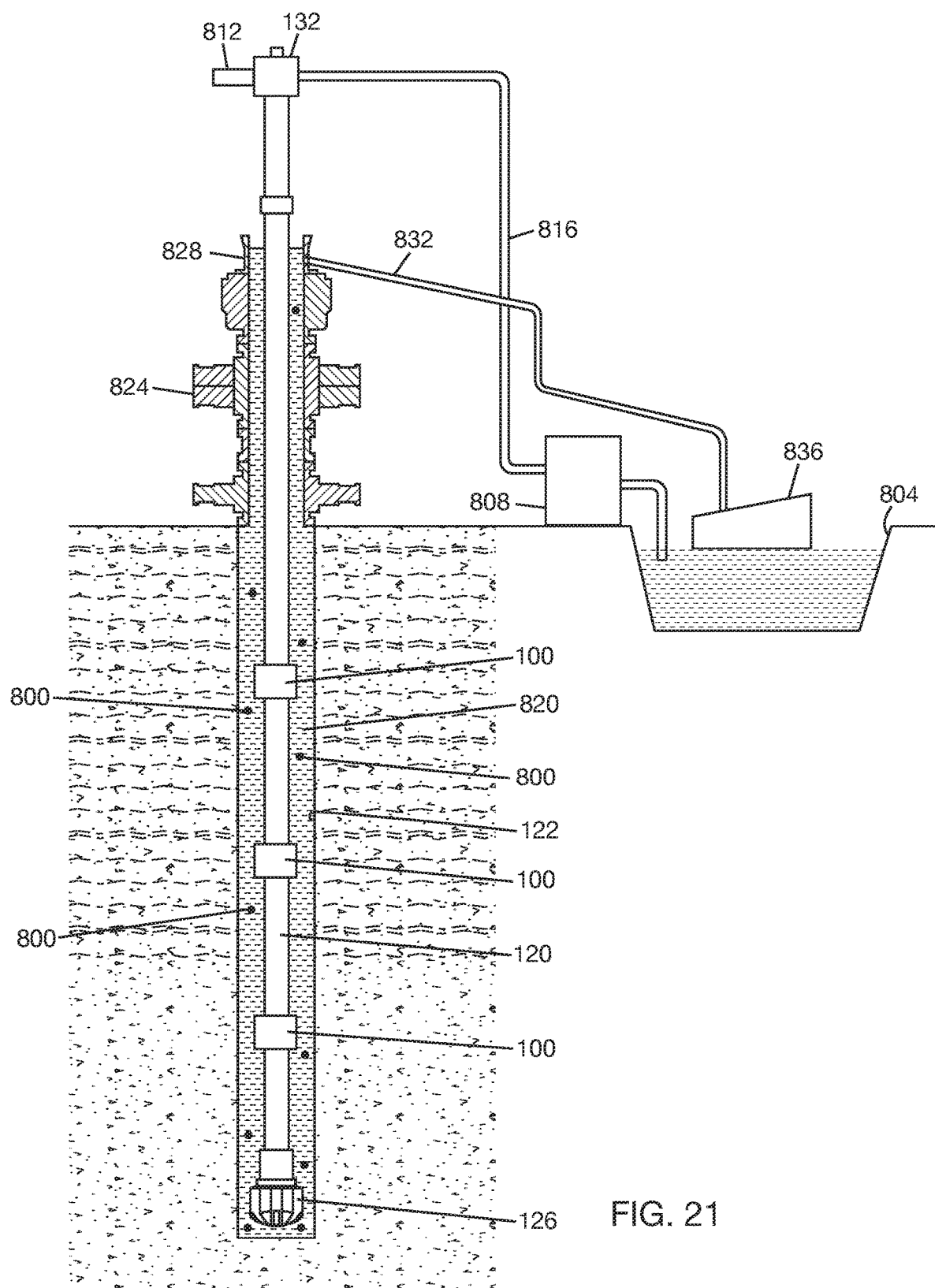
FIG. 21 is a schematic diagram of a drilling system showing injection of memory capsules into a well to gather data from SPSMs on a drill string.

FIG. 21 shows an example of injecting memory capsules 800 into a well to gather data from SPSMs 100. Drilling fluid, also known as "mud", is pumped from a mud pit 804 into drill string 120 by a pump 808. The drilling fluid from pump 808 flows through pathways in top drive 132 to enter into drill string 120. Memory capsules 800 may be disposed in the drilling fluid to be pumped into drill string 120, e.g., through a port 812 connected to top drive 132. The drilling fluid carrying memory capsules 800 will flow down drill string 120 and exit through the nozzles in drill bit 126 into the bottom of wellbore 122. The drilling fluid with memory capsules 800 will then flow up the well annulus 820 (i.e., the annulus between the wall of wellbore 122 and drill string 120), gathering data as they flow past SPSMs 100. Drilling fluid flows up well annulus 820, through an annulus in a wellhead assembly 824, to a bell nipple 828. Bell nipple 828 is a flow conduit having a side outlet that is connected to a flowline 832 that empties into a shale shaker 836 (part of a mud treatment system). Memory capsules 800 can be collected at bell nipple 828, at some point along flowline 832, or at shale shaker 836. After collecting memory capsules 800 at the surface, the data stored in memory capsules 800 can be downloaded. After downloading the data, memory capsules 800 can be returned to the well to collect more data from SPSMs 100. An alternative to pumping memory capsules 800 through drill string 120 is to pump memory capsules 800 down well annulus 820 from the surface. For example, memory capsules 800 may be suspended in drilling fluid, and a tubing (not shown) may be inserted into well annulus 820 to pump the drilling fluid and memory capsules into well annulus 820 for data gathering purposes. The returning drilling fluid in well annulus 820 will push memory capsules 800 back to the surface, where they can be collected for data downloading.

Figure 22:
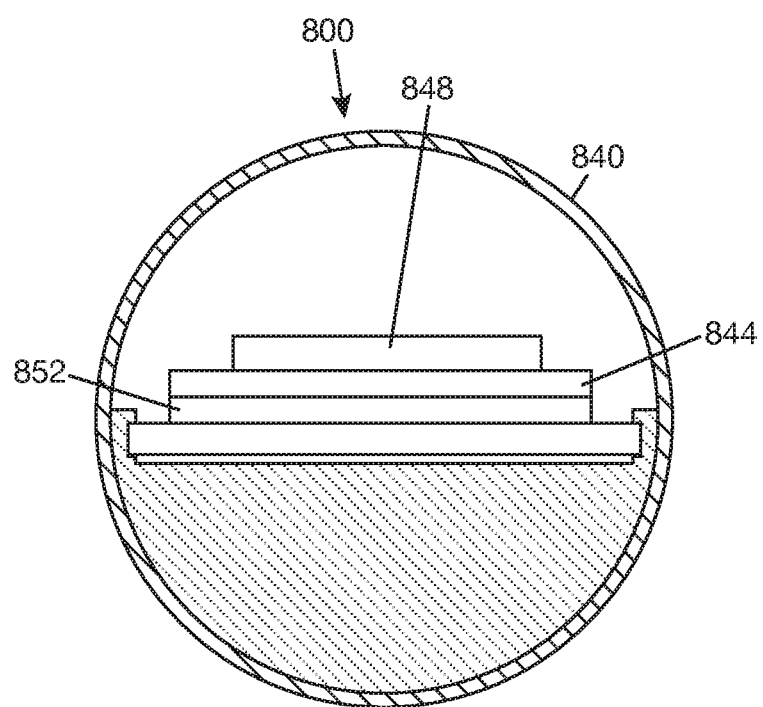
FIG. 22 is a schematic diagram of an example memory capsule.

Referring to FIG. 22, each memory capsule 800 may include modules such as a microcontroller 844, a transceiver 848, and a rechargeable power source 852. These modules may be manufactured on the same substrate to form a system-on-chip package. The package can be made very small using techniques such as segmenting and stacking of modules and interconnection of the modules with short signal paths known as through-chip via or through-silicon via. These techniques allow the same chip area to be used for all the different modules without compromises in material selection, resulting in seamless interlayer communication for interoperability of diverse modules. Transceiver 848 allows memory capsule 800 to communicate with SPSM 100. Rechargeable power source 852 provides power to microcontroller 844 and transceiver 848. Rechargeable power source 852 may be a capacitor-based energy storage, such as a supercapacitor. Microcontroller 844 includes a processor, memory, and other circuitry. Memory capsule 800 includes a protective outer shell 840 around the electronics package. Protective shell 840 may be a container made of a material or having an exterior coated with a material that can withstand continuous exposure to the harsh downhole environment. A protective shell can be formed with chemical coatings such as polymers and/or epoxy, resin-based materials, or any material that can withstand continuous exposure to the harsh downhole environment. Memory capsule 800 is shown as having a spherical shape. However, memory capsule 800 is not limited to this shape. Memory capsule 800 could have an oblong shape or cube shape, for example. In cases where memory capsule 800 may need to exit through a nozzle in a drill bit, capsule 800 may be sized to pass through the nozzle of the drill bit. In some cases, capsule 800 may be flexible so that it can be squeezed through the passage of the nozzle. This may allow memory capsule 800 to be slightly larger than the passage diameter of the nozzle. Memory capsule 800 has low power requirements since it only contains a transceiver, a microcontroller, and a rechargeable power storage, making capsule 800 suitable for IoT platforms. The power storage can be recharged using energies harvested by the capsule from flowing with the drilling fluid. For example, memory capsule 800 could include a small turbine to harvest energy.

In general, the amount of stored data in a SPSM 100 that can be transferred to a mobile memory capsule 800 is limited. In this case, SPSM 100 can use processing-in-memory (PIM) architecture. In PIM, large volumes of data is computed, analyzed, and turned into information and real-time insights by bringing computation closer to the data, instead of moving the data across to the CPU. This way, the data needed to be transferred from a SPSM to a memory capsule could be largely reduced along with the required power for data transmission. The data from the different sensors in SPSM 100 may be stored in the SPSM memory separated by unique headers that identify the source of the sensor data. Not all the sensor data has to be transferred to the memory capsule. Instead, a snapshot of the data, such as maximum, minimum, average values or anomalies that would still provide valuable data to the driller at the surface, may be transferred. The data in the memory capsules can be static random-access memory (SRAM), where the data will remain as long as the capsules are powered. They can be integrated on-chip as random access memory (RAM) or cache memory in microcontrollers, Application Specific Integrated Circuits (ASICS), Field Programmable Gate Arrays (FPGAs), or Complex programmable logic devices (CPLDs).

For the purpose of data gathering by the memory capsules, the transceivers in SPSMs 100 preferably support short-range wireless data transfer with ultra-low latency and ultra-low power requirements. Some methods include ultra-wideband (UWB) communication with short pulses rather than carrier frequencies. The electric and/or magnetic dipole antennas are also optimized for ultra-low latency and ultra-low power data transfer. Examples include, wide-band microstrip, wide-band monopole antenna over a plate, wide-slot UWB antenna, stacked patch UWB antenna, taper slot (TSA) UWB antenna, elliptical printed monopole UWB antenna, metamaterial (MTM) structure UWB antennas, and dielectric resonator antennas (DRAs).

Prior to data transfer from SPSMs 100 to memory capsules 800, a command may be sent from the surface to change antennas in the array of SPSMs 100 into transmit mode to enable transfer of data from SPSMs 100 to memory capsules 800 when memory capsules 800 are flowing with drilling fluid inside the well. Alternatively, specific capsules may be deployed into the well ahead of data gathering memory capsules. The specific capsules may send commands to SPSMs 100 from inside the well to change antennas in SPSMs into transmit mode. The data gathering memory capsules can then flow past SPSMs 100 and collect data from the SPSMs. Some methods may also include ultra-fast wake up and data transfer times so that a memory capsule can send a signal to change the transceiver status of a SPSM 100 to 'active' from its 'sleep' status and then obtain data. The memory capsules 'listen' to the data transmission to receive and store the data in their internal memories and then travel back to the surface with the data.

Although specific embodiments, implementations, and examples have been described for illustrative purposes, various equivalent modifications can be made without departing from the spirit and scope of the disclosure, as will be recognized by those skilled in the relevant art. The teachings provided herein can be applied to other environments besides the drilling environment.

What is claimed is:

1. A system comprising:
a drill string suspended in a wellbore and comprising at least one drill pipe and a drill bit;
a plurality of sensing modules positioned along a length of the drill string, each of the sensing modules comprising:
a pipe-in-pipe structure comprising an outer structure body having a cavity and an inner structure body rotatably supported within the cavity, the pipe-in-pipe structure coupled to the drill string such that rotation of the drill string produces a relative rotation between the outer structure body and the inner structure body;
a plurality of ball elements disposed in a gap between the outer structure body and the inner structure body, the plurality of ball elements movable along a predetermined path defined in the gap in response to the relative rotation between the inner structure body and the outer structure body;
a plurality of movable elements positioned to physically interact with the plurality of ball elements as the plurality of ball elements move along the predetermined path;
a plurality of energy harvesters positioned to generate electrical energy from mechanical energy produced by the physical interaction between the ball elements and the movable elements; and
at least one sensor to measure one or more parameters in an environment of the drill string; and
at least one memory capsule that is movable in a stream of drilling fluid flowing through an annulus formed between the wellbore and the drill string, the at least one memory capsule having characteristics to wirelessly communicate with at least one of the sensing modules and receive sensor measurement data from the at least one of the sensing modules by the at least one memory capsule moving in the stream of drilling fluid through the annulus.

2. The system of claim 1, wherein the energy harvesters associated with each sensing module generate electrical energy based on one of triboelectric effect, piezoelectric effect, and magnetostrictive effect.

3. The system of claim 1, wherein each of the sensing modules comprises an energy storage to store the electrical energy generated by the energy harvesters, and
wherein the at least one sensor in each sensing module is coupled to receive electrical power from the energy storage associated with the sensing module.

4. The system of claim 1, wherein each of the sensing modules comprises at least one communication device for transmitting and receiving signals.

5. The system of claim 1, wherein the at least one memory capsule has at least one of a size and flexibility to pass through a nozzle of the drill bit.

6. A method comprising:
disposing a plurality of sensing modules along a length of the drill string such that rotation of the drill string produces a relative rotation between an outer structure body and an inner structure body of each sensing module;
disposing the drill string with the sensing modules in a wellbore;
rotating the drill string to drill the wellbore and cause relative rotation between the outer structure body and the inner structure body of each sensing module;
producing mechanical energy in each sensing module by ball elements of the sensing module that physically interact with movable elements of the sensing module as a result of the relative rotation between the outer structure body and the inner structure body of the sensing module;
converting the mechanical energy to electrical energy by energy harvesting elements in the sensing modules;
measuring one or more parameters in the wellbore by at least one sensor in each sensing module;
storing data outputted by the at least one sensor in each sensing module in a memory of the sensing module; and
wirelessly receiving at least a portion of the data stored in at least one of the sensing modules by at least one memory capsule moving through an annulus formed between the wellbore and the drill string.

7. The method of claim 6, further comprising storing the electrical energy in an energy storage in each sensing module and powering the at least one sensor in each sensing module with at least a portion of the electrical energy stored in the energy storage of the respective sensing module.

8. The method of claim 6, further comprising transmitting at least a portion of the data stored in the memory of each sensing module to a surface location.

9. The method of claim 8, wherein transmitting at least a portion of the data stored in each sensing module to a surface location comprises relaying signals carrying the at least a portion of the data from one sensing module to another sensing module along the length of the drill string.

10. The method of claim 6, further comprising generating a snapshot of the data stored in the memory of the at least one of the sensing modules;
wherein wirelessly receiving at least a portion of the data stored in at least one of the sensing modules by at least one memory capsule comprises wirelessly receiving the snapshot of the data.

11. The method of claim 6, further comprising deploying the at least one memory capsule into the annulus from a surface location.

12. The method of claim 11, wherein deploying the at least one memory capsule into the annulus from the surface location comprises disposing the at least one memory capsule into a drilling fluid and pumping the drilling fluid through the drill string into the wellbore.

13. An apparatus comprising:
- a pipe-in-pipe structure positioned along a length of a drill string suspended in a wellbore, the pipe-in-pipe structure comprising an outer structure body having a cavity and an inner structure body rotatably supported within the cavity, the outer structure body and the inner structure body separated by a gap, the inner structure body having a central bore;
- a plurality of ball elements disposed in the gap and movable along a predetermined path defined in the gap in response to a relative motion between the inner structure body and the outer structure body;
- a plurality of movable elements positioned to physically interact with the plurality of ball elements as the plurality of ball elements move along the predetermined path;
- a plurality of energy harvesters positioned to generate electrical energy from mechanical energy produced by the physical interaction between the ball elements and the movable elements;
- at least one sensor carried by the outer structure body and powered by the electrical energy to measure one or more parameters in an environment of the drill string;
- at least one communication device carried by the outer structure body for transmitting and receiving sensor measurement data of the at least one sensor; and
- at least one memory capsule that is movable in a stream of drilling fluid through an annulus formed between the wellbore and the drill string, the at least one memory capsule having characteristics to wirelessly communicate with the at least one communication device and receive the sensor measurement data from the at least one communication device by the at least one memory capsule moving in the stream of drilling fluid through the annulus.

14. The apparatus of claim 13, wherein the plurality of energy harvesters generate electrical energy based on one of triboelectric effect, piezoelectric effect, and magnetostrictive effect.

15. The apparatus of claim 13, further comprising an energy storage to store the electrical energy and to power the at least one sensor,
wherein the energy storage is carried by the outer structure body.

* * * * *